(12) United States Patent
Hatta et al.

(10) Patent No.: US 12,529,137 B2
(45) Date of Patent: *Jan. 20, 2026

(54) METHOD OF MANUFACTURING SEMICONDUCTOR DEVICE, SUBSTRATE PROCESSING APPARATUS, AND RECORDING MEDIUM

(71) Applicant: Kokusai Electric Corporation, Tokyo (JP)

(72) Inventors: Hiroki Hatta, Toyama (JP); Takeo Hanashima, Toyama (JP); Koei Kuribayashi, Toyama (JP); Shin Sone, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 153 days.

This patent is subject to a terminal disclaimer.

(21) Appl. No.: 18/359,107

(22) Filed: Jul. 26, 2023

(65) Prior Publication Data

US 2023/0407472 A1 Dec. 21, 2023

Related U.S. Application Data

(63) Continuation of application No. 17/139,262, filed on Dec. 31, 2020, now Pat. No. 11,753,716, which is a (Continued)

(30) Foreign Application Priority Data

Jul. 5, 2018 (JP) .................................. 2018-128518

(51) Int. Cl.
*C23C 16/455* (2006.01)
*C23C 16/30* (2006.01)
(Continued)

(52) U.S. Cl.
CPC ...... *C23C 16/45527* (2013.01); *C23C 16/308* (2013.01); *C23C 16/345* (2013.01);
(Continued)

(58) Field of Classification Search
CPC ............ C23C 16/45527; C23C 16/308; C23C 16/345; C23C 16/401; C23C 16/45548;
(Continued)

(56) References Cited

U.S. PATENT DOCUMENTS 11,753,716 B2 * 9/2023 Hatta ................ C23C 16/45527
438/761
2011/0186984 A1 8/2011 Saito et al.
(Continued)

FOREIGN PATENT DOCUMENTS

| JP | 10-212575 A | 8/1998 |
| JP | 2014-236129 A | 12/2014 |
| WO | 2015/045137 A1 | 4/2015 |

OTHER PUBLICATIONS

International Search Report, PCT/JP2019/008424, Apr. 9, 2019, 2 pgs.
(Continued)

*Primary Examiner* — Gordon Baldwin
*Assistant Examiner* — Christina D McClure
(74) *Attorney, Agent, or Firm* — Volpe Koenig

(57) ABSTRACT

There is provided a technique that includes forming a film on at least one substrate by performing a cycle a predetermined number of times, the cycle including non-simultaneously performing: (a) performing a first set a number of times, the first set including non-simultaneously performing: supplying a precursor to the at least one substrate from at least one first ejecting hole of a first nozzle arranged along a substrate arrangement direction of a substrate arrangement region where the at least one substrate is arranged; and supplying
(Continued)

a reactant to the at least one substrate; and (b) performing a second set a number of times, the second set including non-simultaneously performing: supplying the precursor to the at least one substrate from at least one second ejecting hole of a second nozzle arranged along the substrate arrangement direction of the substrate arrangement region; and supplying the reactant to the at least one substrate.

19 Claims, 12 Drawing Sheets

Related U.S. Application Data continuation of application No. PCT/JP2019/008424, filed on Mar. 4, 2019.

(51) Int. Cl.
 *C23C 16/34* (2006.01)
 *C23C 16/40* (2006.01)
 *H01L 21/02* (2006.01)

(52) U.S. Cl.
 CPC ........ *C23C 16/401* (2013.01); *H01L 21/0228* (2013.01); *H01L 21/0214* (2013.01); *H01L 21/02164* (2013.01); *H01L 21/0217* (2013.01); *H01L 21/02211* (2013.01)

(58) Field of Classification Search
 CPC ........ C23C 16/45574; C23C 16/45578; C23C 16/45546; C23C 16/45523; C23C 16/309; H01L 21/0228; H01L 21/0214; H01L 21/02164; H01L 21/0217; H01L 21/02211; H01L 21/02126
 See application file for complete search history.

(56) References Cited

U.S. PATENT DOCUMENTS

| | | |
|---|---|---|
| 2011/0318940 A1 | 12/2011 | Ota et al. |
| 2012/0156886 A1 | 6/2012 | Shirako et al. |
| 2014/0357058 A1 | 12/2014 | Takagi et al. |
| 2017/0081761 A1 | 3/2017 | Chuang et al. |

OTHER PUBLICATIONS

Korean Office Action, Korean Patent Application No. 10-2020-7037863, May 26, 2023.

* cited by examiner

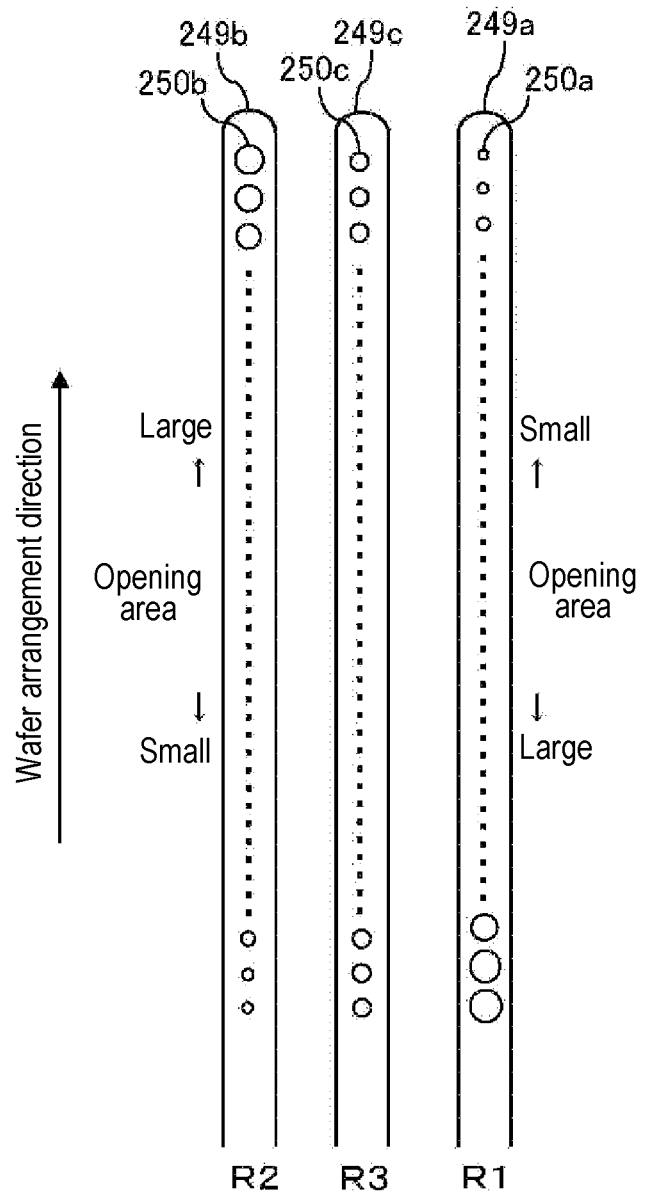

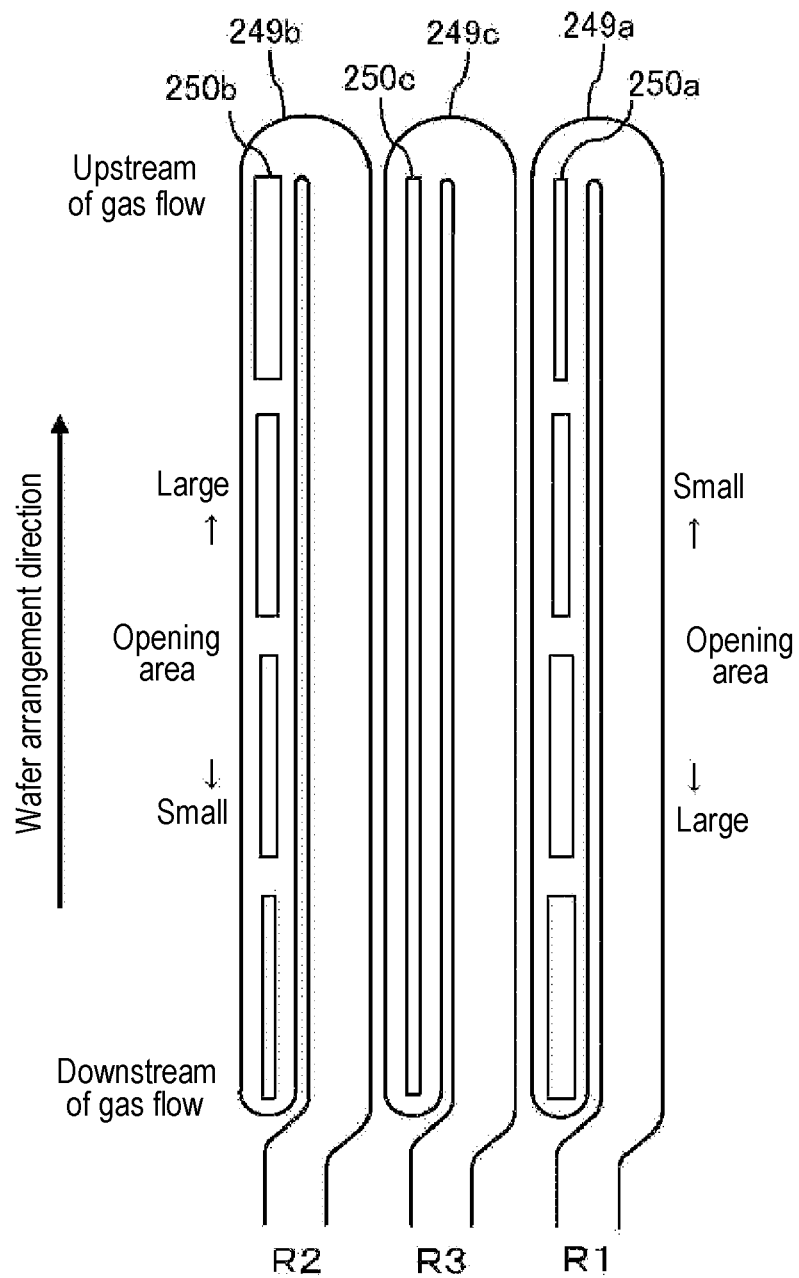

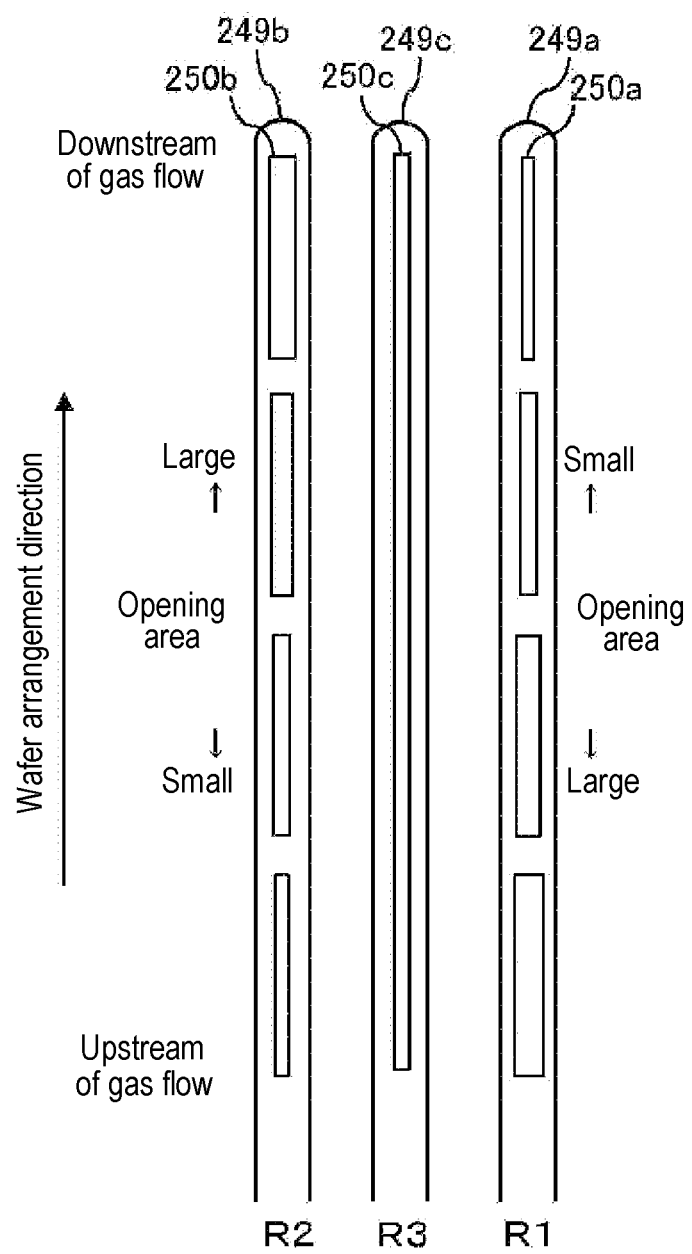

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

The application is a continuation of U.S. patent application Ser. No. 17/139,262, filed on Dec. 31, 2020, which is a Bypass Continuation Application of PCT International Application No. PCT/JP2019/008424, filed on Mar. 4, 2019 and designating the United States, the international application being based upon and claiming the benefit of priority from Japanese Patent Application No. 2018-128518, filed on Jul. 5, 2018, the entire content of which is incorporated herein by reference.

TECHNICAL FIELD

The present disclosure relates to a method of manufacturing a semiconductor device, a substrate processing apparatus, and a recording medium.

BACKGROUND

In the related art, as a process of manufacturing a semiconductor device, a substrate processing process of supplying a precursor or a reactant to substrates arranged and heated in a process chamber to form films on the substrates may be often carried out.

SUMMARY

When performing the above-mentioned process, an amount of precursors and the like supplied to the substrates, thermal history, and the like may become non-uniform among the substrates. As a result, an inter-substrate film thickness distribution of the films formed on the substrates may deviate from a desired distribution. Some embodiments of the present disclosure provide a technique capable of controlling an inter-substrate film thickness distribution of films formed on substrates arranged in a process chamber.

According to an embodiment of the present disclosure, there is provided a technique that includes: forming a film on at least one substrate by performing a cycle a predetermined number of times, the cycle including non-simultaneously performing: (a) performing a first set a predetermined number of times, the first set including non-simultaneously performing: supplying a precursor to the at least one substrate from at least one first ejecting hole of a first nozzle arranged along a substrate arrangement direction of a substrate arrangement region where the at least one substrate is arranged; and supplying a reactant to the at least one substrate; and (b) performing a second set a predetermined number of times, the second set including non-simultaneously performing: supplying the precursor to the at least one substrate from at least one second ejecting hole of a second nozzle arranged along the substrate arrangement direction of the substrate arrangement region; and supplying the reactant to the at least one substrate, wherein a structure of the first nozzle and a structure of the second nozzle are different from each other, and at least a portion of an installation region of the at least one first ejecting hole in the first nozzle and at least a portion of an installation region of the at least one second ejecting hole in the second nozzle overlap each other in the substrate arrangement direction.

BRIEF DESCRIPTION OF DRAWINGS

The accompanying drawings, which are incorporated in and constitute a part of the specification, illustrate embodiments of the present disclosure.

FIG. 7B is a schematic configuration view of a modification of the first to third nozzles suitably used in embodiments of the present disclosure.

FIGS. 8A and 8B are schematic configuration views of a modification of the first to third nozzles suitably used in embodiments of the present disclosure, respectively.

DETAILED DESCRIPTION

Embodiments of the Present Disclosure

Embodiments of the present disclosure will be now described with reference to FIGS. 1 to 4, FIG. 7A, and the like.

(1) Configuration of Substrate Processing Apparatus

Figure 1:
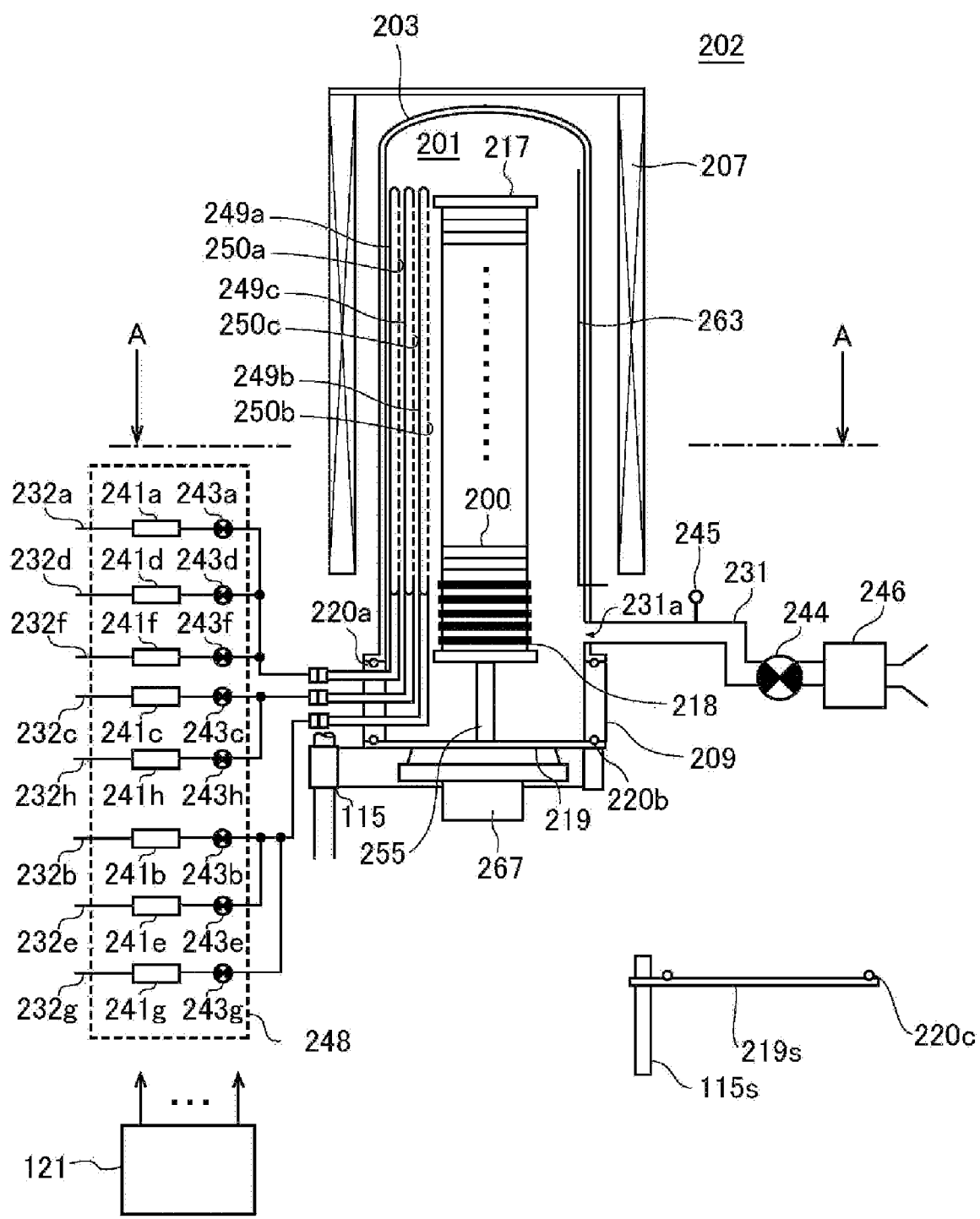
FIG. 1 is a schematic configuration view of a vertical process furnace of a substrate processing apparatus suitably used in embodiments of the present disclosure, in which a portion of the process furnace is shown in a vertical cross section.

As illustrated in FIG. 1, a process furnace 202 includes a heater 207 as a heating mechanism (temperature regulation part). The heater 207 has a cylindrical shape and is supported by a holding plate so as to be vertically installed. The heater 207 also functions as an activation mechanism (an excitation part) configured to thermally activate (excite) a gas.

A reaction tube 203 is disposed inside the heater 207 to be concentric with the heater 207. The reaction tube 203 is made of a heat resistant material, for example, quartz ($SiO_2$), silicon carbide (SiC) and the like, and has a cylindrical shape with its upper end closed and its lower end opened. A manifold 209 is disposed below the reaction tube 203 in a concentric relationship with the reaction tube 203. The manifold 209 is made of a metal material, for example, stainless steel (SUS), and has a cylindrical shape with its upper and lower ends opened. The upper end of the manifold 209 engages with the lower end of the reaction tube 203, and the manifold 209 is configured to support the reaction tube 203. An O-ring 220a as a seal member is installed between the manifold 209 and the reaction tube 203. Similar to the heater 207, the reaction tube 203 is vertically installed. A processing vessel (reaction vessel) mainly includes the reaction tube 203 and the manifold 209. A process chamber 201 is formed in a hollow cylindrical portion of the processing vessel. The process chamber 201 is configured to be capable of accommodating wafers 200 as substrates. The processing of the wafers 200 is performed in the process chamber 201.

Nozzles 249a to 249c as first to third supply parts are installed in the process chamber 201 to penetrate through a sidewall of the manifold 209. The nozzles 249a to 249c are made of, for example, a heat resistant material such as quartz and SiC. The nozzles 249a to 249c are also referred to as first and third nozzles, respectively. Gas supply pipes 232a to 232c are connected to the nozzles 249a to 249c, respectively. The nozzles 249a to 249c are different nozzles, and each of the nozzles 249a and 249b is installed adjacent to the nozzle 249c and is disposed to sandwich the nozzle 249c from both sides thereof. The gas supply pipes 232a to 232c may be included in the first to third supply parts, respectively.

Mass flow controllers (MFCs) 241a to 241c, which are flow rate controllers (flow rate control parts), and valves 243a to 243c, which are opening/closing valves, are installed at the gas supply pipes 232a to 232c, respectively, sequentially from an upstream side of gas flow. Gas supply pipes 232d and 232f are respectively connected to the gas supply pipe 232a at a downstream side of the valve 243a. Gas supply pipes 232e and 232g are respectively connected to the gas supply pipe 232b at a downstream side of the valve 243b. A gas supply pipe 232h is connected to the gas supply pipe 232c at a downstream side of the valve 243c. MFCs 241d to 241h and valves 243d to 243h are installed at the gas supply pipes 232d to 232h, respectively, sequentially from an upstream side of gas flow. The gas supply pipes 232a to 232h are made of the metal material, for example, stainless steel (SUS)

Figure 2:
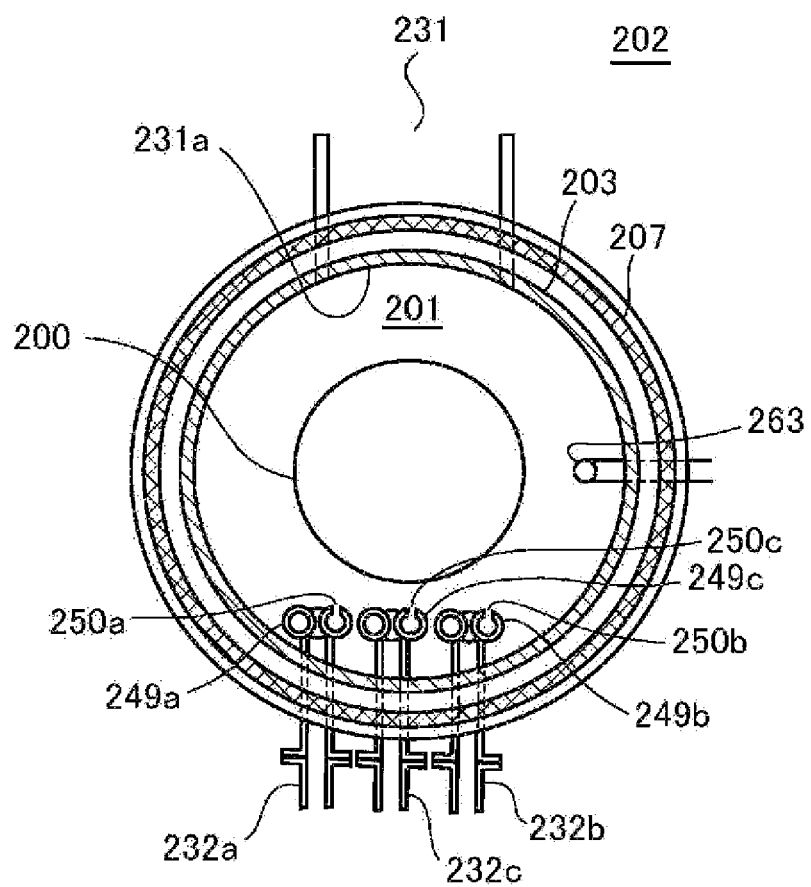
FIG. 2 is a schematic configuration view of the vertical process furnace of the substrate processing apparatus suitably used in the embodiments of the present disclosure, in which a portion of the process furnace is shown in a cross section taken along line A-A in FIG. 1.

As illustrated in FIG. 2, each of the nozzles 249a to 249c is disposed in an annular space (in a plane view) between an inner wall of the reaction tube 203 and the wafers 200 to installed from a lower portion to an upper portion of the inner wall of the reaction tube 203, that is, along a wafer arrangement direction. Specifically, each of the nozzles 249a to 249c is installed at a region horizontally surrounding a wafer arrangement region in which the wafers 200 are arranged at a lateral side of a space where the wafers 200 are arranged (hereinafter, referred to as the wafer arrangement region), to extend along the wafer arrangement region. In the plane view, the nozzle 249c is disposed to face an exhaust port 231a to be described below in a straight line with centers of the wafers 200 loaded into the process chamber 201 interposed therebetween. The nozzles 249a and 249b are arranged adjacent to the nozzle 249c with a straight line passing through the nozzle 249c and the exhaust port 231a interposed therebetween. In other words, the nozzles 249a and 249b are arranged on both sides of the nozzle 249c with the nozzle 249c interposed therebetween, that is, arranged to sandwich the nozzle 249c between the both sides along the inner wall of the reaction tube 203 (an outer peripheral portion of the wafers 200).

Figure 7A:
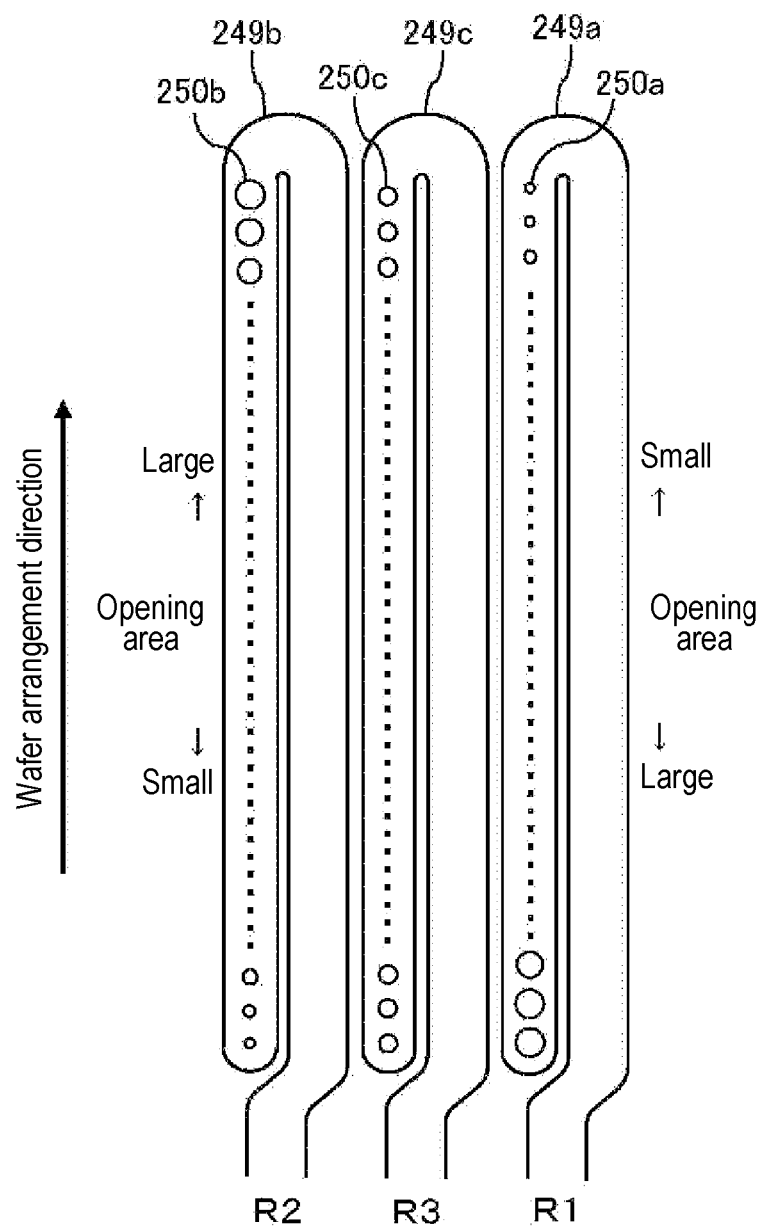
FIG. 7A is a schematic configuration view of first to third nozzles suitably used in embodiments of the present disclosure.

As illustrated in FIG. 7A, each of the nozzles 249a to 249c is configured as a U-shaped nozzle (U-turn nozzle or return nozzle) having a portion bent in an inverted U shape (bent portion) at the top of the nozzles 249a to 249c, that is, above an upper end of the wafer arrangement region. First to third ejecting holes configured to supply (eject) a gas are arranged on the side surfaces of the nozzles 249a to 249c along the wafer arrangement direction. The first to third ejecting holes have a shape including a plurality of gas ejecting holes 250a to 250c, respectively. The plurality of gas ejecting holes 250a to 250c are arranged from one end to the other end side of the wafer arrangement region in the wafer arrangement direction. Each of the gas ejecting holes 250a to 250c is opened to face the exhaust port 231a in the plane view such that a gas can be supplied toward the wafers 200. Shapes of the gas ejecting holes 250a to 250c viewed from the wafer arrangement region are circular, respectively.

The nozzles 249a to 249c have different structures from one another. Specifically, at least one selected from the group of opening areas of the first and second ejecting holes and shapes of the first and second ejecting holes are different from each other.

In the present embodiment, as an example, the opening area of each of the plurality of gas ejecting holes 250a formed on a side surface of the nozzle 249a becomes smaller as it goes from one end toward the other end of the wafer arrangement region in the wafer arrangement direction (here, from a lower side toward an upper side of the wafer arrangement region). Further, the opening area of each of the plurality of gas ejecting holes 250b formed on the side surface of the nozzle 249b becomes larger as it goes from the one end toward the other end of the wafer arrangement region in the wafer arrangement direction (here, from the lower side toward the upper side of the wafer arrangement region). The opening area of each of the plurality of gas ejecting holes 250c formed on the side surface of the nozzle 249c is not particularly limited, but in the present embodiment, as an example, the opening area has a uniform size across a region from the one end to the other end of the wafer arrangement region in the wafer arrangement direction (here, from the lower side to the upper side of the wafer arrangement region). In the present embodiment, the lower side of the wafer arrangement region corresponds to the downstream side of the gas flow in the nozzles 249a to 249c and the process chamber 201, and the upper side of the wafer arrangement region corresponds to the upstream side of the gas flow in the nozzles 249a to 249c and the process chamber 201.

Further, at least a portion of an installation region of the first ejecting holes of the nozzle 249a and at least a portion of an installation region of the second ejecting holes of the nozzle 249b overlap each other in the wafer arrangement direction.

In the present embodiment, as an example, the entire installation regions of the gas ejecting holes 250a to 250c in the nozzles 249a to 249c overlap one another in the wafer arrangement direction. The gas ejecting holes 250a having the opening area set to be large in the nozzle 249a and the gas ejecting holes 250b having the opening area set to be small in the nozzle 249b are respectively arranged at height positions corresponding to each other in the wafer arrangement region, that is, at height positions corresponding to each other (similar height positions) on the lower side of the wafer arrangement region. Further, the gas ejecting holes 250a having the opening area set to be small in the nozzle 249a and the gas ejecting holes 250b having the opening area set to be large in the nozzle 249b are respectively arranged at height positions corresponding to each other in the wafer arrangement region, that is, at height positions corresponding to each other (similar height positions) on the upper side of the wafer arrangement region.

A precursor (precursor gas), for example, a halosilane-based gas containing silicon (Si) as a main element forming a film to be formed and a halogen element, is supplied from the gas supply pipes 232a and 232b into the process chamber 201 via the MFCs 241a and 241b, the valves 243a and 243b, and the nozzles 249a and 249b, respectively. The precursor gas is a precursor in a gas state, for example, a gas obtained by vaporizing a precursor in a liquid state under normal temperature and normal pressure, a precursor in a gaseous state under normal temperature and normal pressure, and the like. The halosilane precursor refers to a silane precursor containing a halogen group. The halogen group includes a halogen element such as chlorine (Cl), fluorine (F), bromine (Br), and iodine (I). As the halosilane-based gas, for example, a precursor gas containing Si and Cl, that is, a chlorosilane-based gas, may be used. The chlorosilane-based gas acts as a Si source. As the chlorosilane-based gas, for example, a hexachlorodisilane ($Si_2Cl_6$, abbreviation: HCDS) gas may be used.

A reactant (reaction gas), for example, a nitrogen (N)-containing gas, is supplied from the gas supply pipe 232c into the process chamber 201 via the MFC 241c, the valve 243c, and the nozzle 249c. The N-containing gas acts as a nitriding source (a nitriding agent or a nitriding gas), that is, as a N source. As the N-containing gas, for example, an ammonia ($NH_3$) gas, which is a hydrogen nitride-based gas, may be used.

A reactant (reaction gas), for example, an oxygen (O)-containing gas, is supplied from the gas supply pipe 232c into the process chamber 201 via the MFC 241c, the valve 243c, and the nozzle 249c. The O-containing gas acts as an oxidizing source (an oxidizing agent or an oxidizing gas), that is, as an O source. As the O-containing gas, for example, an oxygen ($O_2$) gas may be used.

A hydrogen (H)-containing gas is supplied from the gas supply pipes 232d and 232e into the process chamber 201 via the MFCs 241d and 241e, the valves 243d and 243e, the gas supply pipes 232a and 232b, and the nozzles 249a and 249b, respectively. The H-containing gas alone does not have an oxidizing action, but in a substrate processing process to be described below, the H-containing gas reacts with the O-containing gas under a specific condition to generate oxidizing species such as atomic oxygen (O) to improve an efficiency of an oxidizing process. As the H-containing gas, for example, a hydrogen ($H_2$) gas may be used.

An inert gas, for example, a nitrogen ($N_2$) gas, is supplied from the gas supply pipes 232f to 232h into the process chamber 201 via the MFCs 241f to 241h, the valves 243f to 243h, the gas supply pipes 232a to 232c, and the nozzles 249a to 249c, respectively. The $N_2$ gas acts as a purge gas or a carrier gas.

A first supply system configured to supply the precursor mainly includes the gas supply pipe 232a, the MFC 241a, the valve 243a, and the nozzle 249a. A second supply system configured to supply the precursor mainly includes the gas supply pipe 232b, the MFC 241b, the valve 243b, and the nozzle 249b. A third supply system configured to supply the reactant mainly includes the gas supply pipe 232c, the MFC 241c, the valve 243c, and the nozzle 249c. The third supply system may include the gas supply pipes 232d and 232e, the MFCs 241d and 241e, and the valves 243d and 243e. An inert gas supply system mainly includes the gas supply pipes 232f to 232h, the MFCs 241f to 241h, and the valves 243f and 243h.

One or all of the above-described various supply systems may be configured as an integrated supply system 248 in which the valves 243a to 243h, the MFCs 241a to 241h and the like are integrated. The integrated supply system 248 is connected to each of the gas supply pipes 232a to 232h and configured such that operations of supplying various gases into the gas supply pipes 232a to 232h, that is, an opening/closing operation of the valves 243a to 243h, a flow rate regulating operation by the MFCs 241a to 241h, and the like are controlled by a controller 121 to be described below. The integrated supply system 248 is configured as an integral or divided integration unit, and may be attached to and detached from the gas supply pipes 232a to 232h and the like on an integration unit basis such that maintenance, replacement, extension, and the like of the integrated supply system 248 may be performed on the integration unit basis.

The exhaust port 231a configured to exhaust an internal atmosphere of the process chamber 201 is installed at a lower side of the sidewall of the reaction tube 203. As illustrated in FIG. 2, the exhaust port 231a is installed at a position facing the nozzles 249a to 249c (the gas ejecting holes 250a to 250c) in the plane view, with the wafers 200 interposed therebetween. The exhaust port 231a may be installed between the lower portion and the upper portion of the sidewall of the reaction tube 203, that is, along the wafer arrangement region. An exhaust pipe 231 is connected to the exhaust port 231a. A vacuum pump 246 as a vacuum exhaust device is connected to the exhaust pipe 231 via a pressure sensor 245 as a pressure detector (pressure detection part) which detects the internal pressure of the process chamber 201 and an auto pressure controller (APC) valve 244 as a pressure regulator (pressure regulation part). The APC valve 244 is configured so that a vacuum exhaust and a vacuum exhaust stop of the interior of the process chamber 201 can be performed by opening and closing the APC valve 244 while operating the vacuum pump 246 and so that the internal pressure of the process chamber 201 can be regulated by adjusting an opening degree of the APC valve 244 based on pressure information detected by the pressure sensor 245 while operating the vacuum pump 246. An exhaust system mainly includes the exhaust pipe 231, the APC valve 244 and the pressure sensor 245. The vacuum pump 246 may be regarded as being included in the exhaust system.

A seal cap 219, which serves as a furnace opening lid capable of hermetically sealing a lower end opening of the manifold 209, is installed under the manifold 209. The seal cap 219 is made of, for example, a metal material such as stainless steel (SUS), and is formed in a disc shape. An O-ring 220b, which is a seal member making contact with a lower end of the manifold 209, is installed at an upper surface of the seal cap 219. A rotation mechanism 267 configured to rotate a boat 217 to be described below is installed under the seal cap 219. A rotary shaft 255 of the rotation mechanism 267 is connected to the boat 217 through the seal cap 219. The rotation mechanism 267 is configured to rotate the wafers 200 by rotating the boat 217. The seal cap 219 is configured to be vertically moved up or down by a boat elevator 115 which is an elevating mechanism installed outside the reaction tube 203. The boat elevator 115 is configured as a transfer device (transfer mechanism) which loads/unloads (transfers) the wafers 200 into/out of the process chamber 201 by moving the seal cap 219 up or down. A shutter 219s, which serves as a furnace opening lid capable of hermetically sealing a lower end opening of the manifold 209 in a state where the seal cap 219 is lowered and the boat 217 is unloaded from the process chamber 201, is installed under the manifold 209. The shutter 219s is made of, for example, a metal material such as stainless steel (SUS), and is formed in a disc shape. An O-ring 220c, which is a seal member making contact with the lower end portion of the manifold 209, is installed on an upper surface of the shutter 219s. The opening/closing operation (such as elevation operation and rotation operation) of the shutter 219s is controlled by a shutter opening/closing mechanism 115s.

The boat 217 serving as a substrate support is configured to support a plurality of wafers 200, for example, 25 to 200 wafers, in such a state that the wafers 200 are arranged in a horizontal posture and in multiple stages along a vertical direction with the centers of the wafers 200 aligned with one another, that is, the boat 217 is configured to arrange the wafers 200 to be spaced apart from one another. The boat 217 is made of a heat resistant material such as quartz and SiC. Heat insulating plates 218 made of a heat resistant material such as quartz and SiC are installed below the boat 217 in multiple stages.

A temperature sensor 263 serving as a temperature detector is installed in the reaction tube 203. Based on temperature information detected by the temperature sensor 263, a degree of supplying electric power to the heater 207 is regulated such that the interior of the process chamber 201 has a desired temperature distribution. The temperature sensor 263 is installed along the inner wall of the reaction tube 203.

Figure 3:
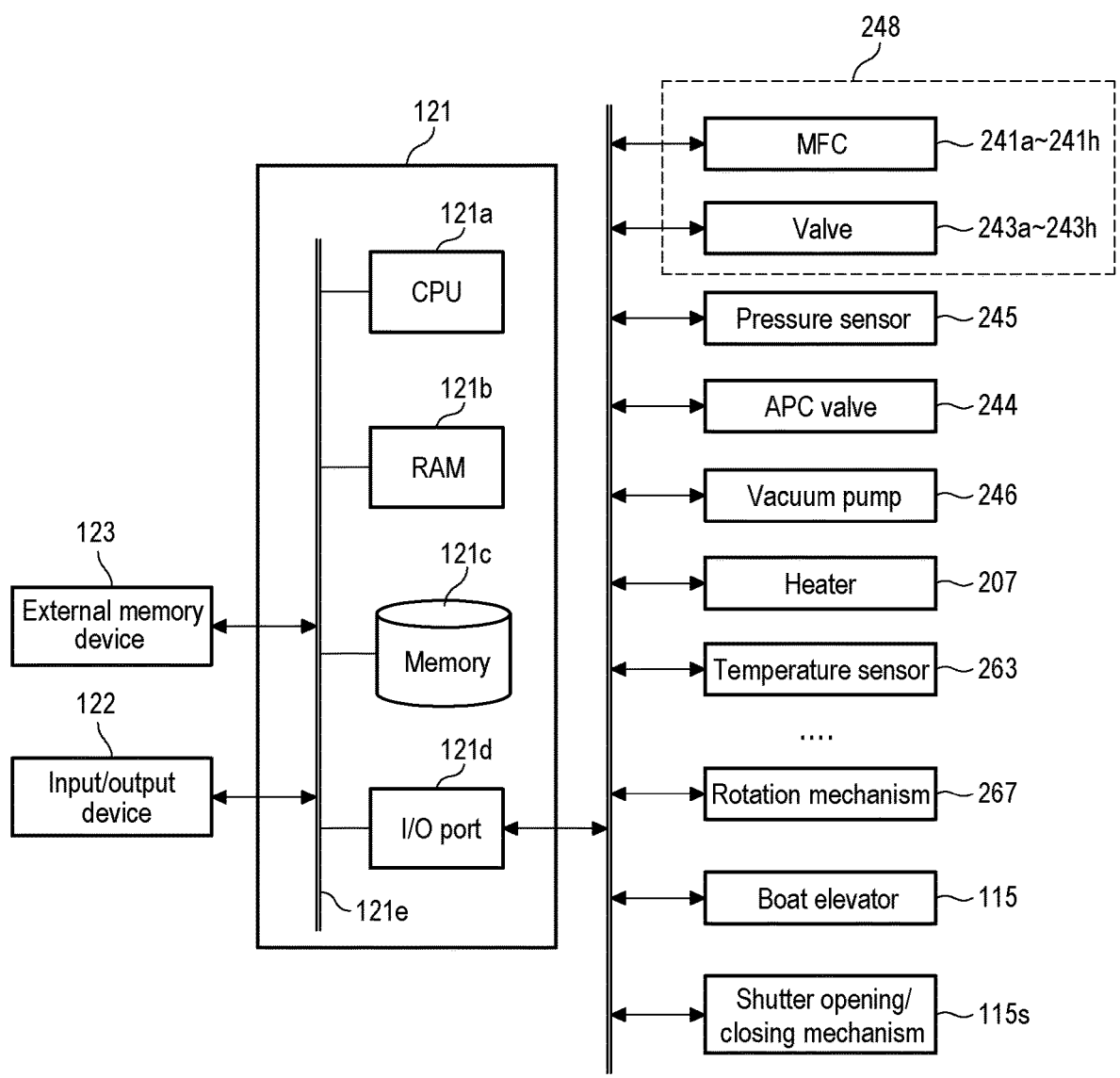
FIG. 3 is a schematic configuration diagram of a controller of the substrate processing apparatus suitably used in embodiments of the present disclosure, in which a control system of the controller is shown in a block diagram.

As illustrated in FIG. 3, the controller 121, which is a control part (control means), may be configured as a computer including a central processing unit (CPU) 121a, a random access memory (RAM) 121b, a memory 121c, and an I/O port 121d. The RAM 121b, the memory 121c, and the I/O port 121d are configured to be capable of exchanging data with the CPU 121a via an internal bus 121e. An input/output device 122 configured as, for example, a touch panel and the like, is connected to the controller 121.

The memory 121c includes, for example, a flash memory, a hard disk drive (HDD), and the like. A control program that controls operations of a substrate processing apparatus, a process recipe in which sequences, conditions and the like of substrate processing to be described below are described, and the like are readably stored in the memory 121c. The process recipe functions as a program configured to be capable of causing the controller 121 to execute each sequence in the substrate processing to be described below, to obtain a predetermined result. Hereinafter, the process recipe, the control program, and the like will be generally and simply referred to as a "program." Furthermore, the process recipe will be simply referred to as a "recipe." When the term "program" is used herein, it may indicate a case of including only the recipe, a case of including only the control program, or a case of including both the recipe and the control program. The RAM 121b is configured as a memory area (a work area) in which a program, data, and the like read by the CPU 121a are temporarily stored.

The I/O port 121d is connected to the MFCs 241a to 241h, the valves 243a to 243h, the pressure sensor 245, the APC valve 244, the vacuum pump 246, the temperature sensor 263, the heater 207, the rotation mechanism 267, the boat elevator 115, the shutter opening/closing mechanism 115s, and the like, as described above.

The CPU 121a is configured to read the control program from the memory 121c and execute the same. The CPU 121a also reads the recipe from the memory 121c according to an input of an operation command from the input/output device 122. In addition, the CPU 121a is configured to control, according to the contents of the recipe thus read, the flow rate regulating operation of various kinds of gases by the MFCs 241a to 241h, the opening/closing operation of the valves 243a to 243h, the opening/closing operation of the APC valve 244, the pressure regulating operation performed by the APC valve 244 based on the pressure sensor 245, the driving and stopping of the vacuum pump 246, the temperature regulating operation performed by the heater 207 based on the temperature sensor 263, the operation of rotating the boat 217 and regulating the rotation speed of the boat 217 with the rotation mechanism 267, the operation of moving the boat 217 up or down with the boat elevator 115, the operation of opening and closing the shutter 219s with the shutter opening/closing mechanism 115s, and the like.

The controller 121 may be configured by installing, on the computer, the aforementioned program stored in an external memory device 123. The external memory device 123 may include, for example, a magnetic disc such as an HDD, an optical disc such as a CD, a magneto-optical disc such as an MO, a semiconductor memory such as a USB memory, and the like. The memory 121c or the external memory device 123 is configured as a computer-readable recording medium. Hereinafter, the memory 121c and the external memory device 123 will be generally and simply referred to as a "recording medium." When the term "recording medium" is used herein, it may indicate a case of including only the memory 121c, a case of including only the external memory device 123, or a case of including both the memory 121c and the external memory device 123. Furthermore, the program may be supplied to the computer by using a communication means such as the Internet or a dedicated line, instead of using the external memory device 123.

(2) Substrate Processing Process

As a process of manufacturing a semiconductor device by using the above-described substrate processing apparatus, a substrate processing sequence example of forming a film on a wafer 200 as a substrate, that is, a film-forming sequence example will be described with reference to FIG. 4. In the following descriptions, operations of the respective parts constituting the substrate processing apparatus are controlled by the controller 121.

Figure 4:
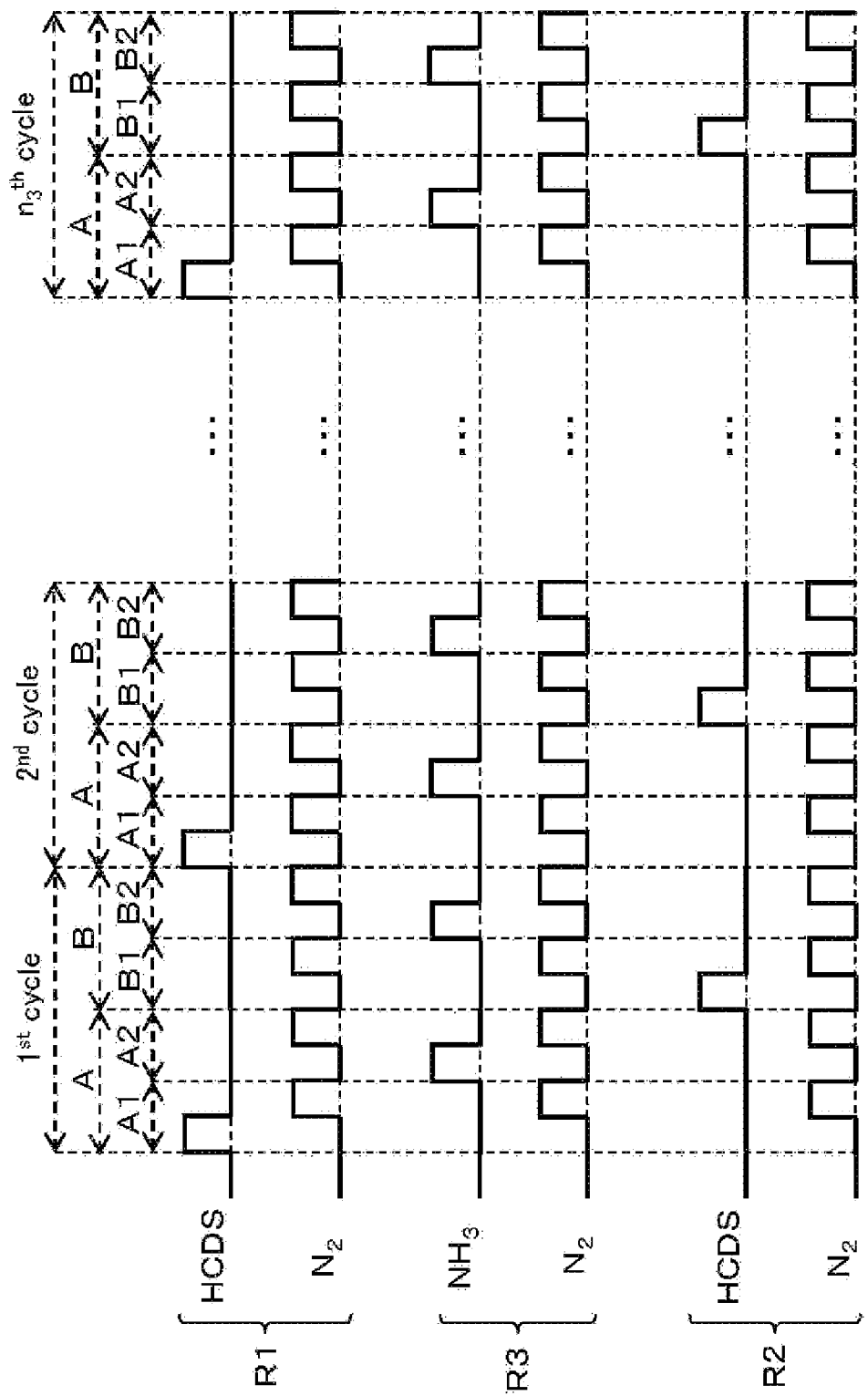
FIG. 4 is a diagram showing a film-forming sequence according to embodiments of the present disclosure.

In the film-forming sequence shown in FIG. 4, a film containing Si and N, that is, a silicon nitride film (SiN film), is formed on a wafer 200 by performing a cycle a predetermined number of times ($n_3$ times, where $n_3$ is an integer of 1 or more), the cycle including non-simultaneously performing:

a first film-forming step of performing a first set a predetermined number of times ($n_1$ time, where $n_1$ is an integer of 1 or more), the first set including non-simultaneously performing:

a step A1 of supplying a HCDS gas as a precursor to the wafer 200 from first ejecting holes of a first nozzle arranged along a wafer arrangement direction of a wafer arrangement region, that is, a plurality of gas ejecting holes 250a formed on the side surface of the nozzle 249a; and a step A2 of supplying a $NH_3$ gas as a reactant to the wafer 200; and a second film-forming step of performing a second set a predetermined number of times ($n_2$ time, where $n_2$ is an integer of 1 or more), the second set including non-simultaneously performing: a step B1 of supplying the HCDS gas as the precursor to the wafer 200 from second ejecting holes of a second nozzle arranged along the wafer arrangement direction of the wafer arrangement region, that is, a plurality of gas ejecting holes 250b formed on the side surface of the nozzle 249b; and a step B2 of supplying the NH$_3$ gas as the reactant to the wafer 200.

When the film-forming sequence shown in FIG. 4 is performed, structures of the nozzles 249a and 249b configured to supply the HCDS gas to the wafer 200 are different as described above. Further, at least a portion of an installation region of the gas ejecting holes 250a in the nozzle 249a and at least a portion of an installation region of the gas ejecting holes 250b in the nozzle 249b overlap each other in the wafer arrangement region. Further, the NH$_3$ gas is supplied to the wafer 200 from third ejecting holes of a third nozzle, that is, a plurality of gas ejecting holes 250c formed on the side surface of the nozzle 249c.

Figure 5:
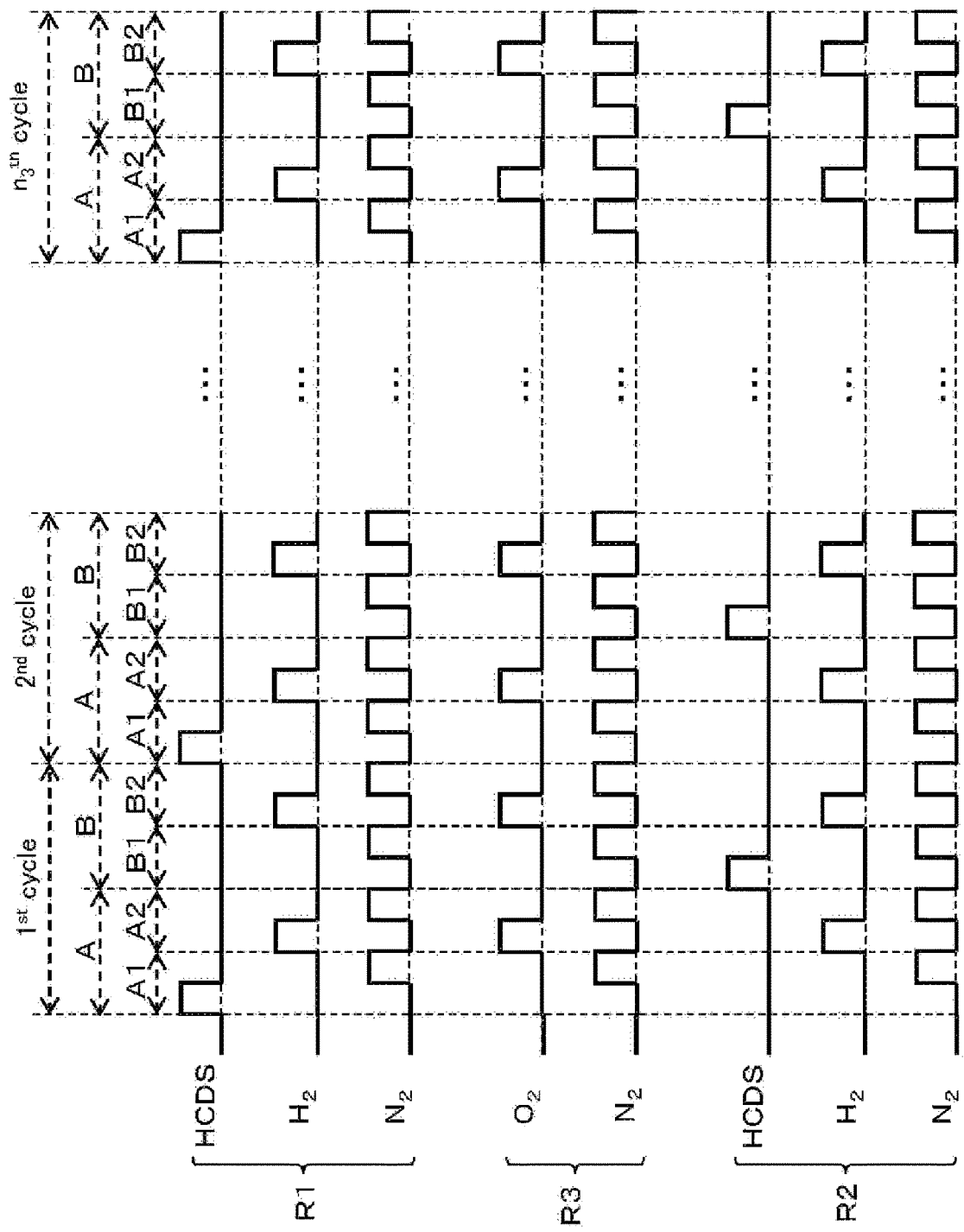
FIG. 5 is a diagram showing a modification of a film-forming sequence according to embodiments of the present disclosure.
Figure 6:
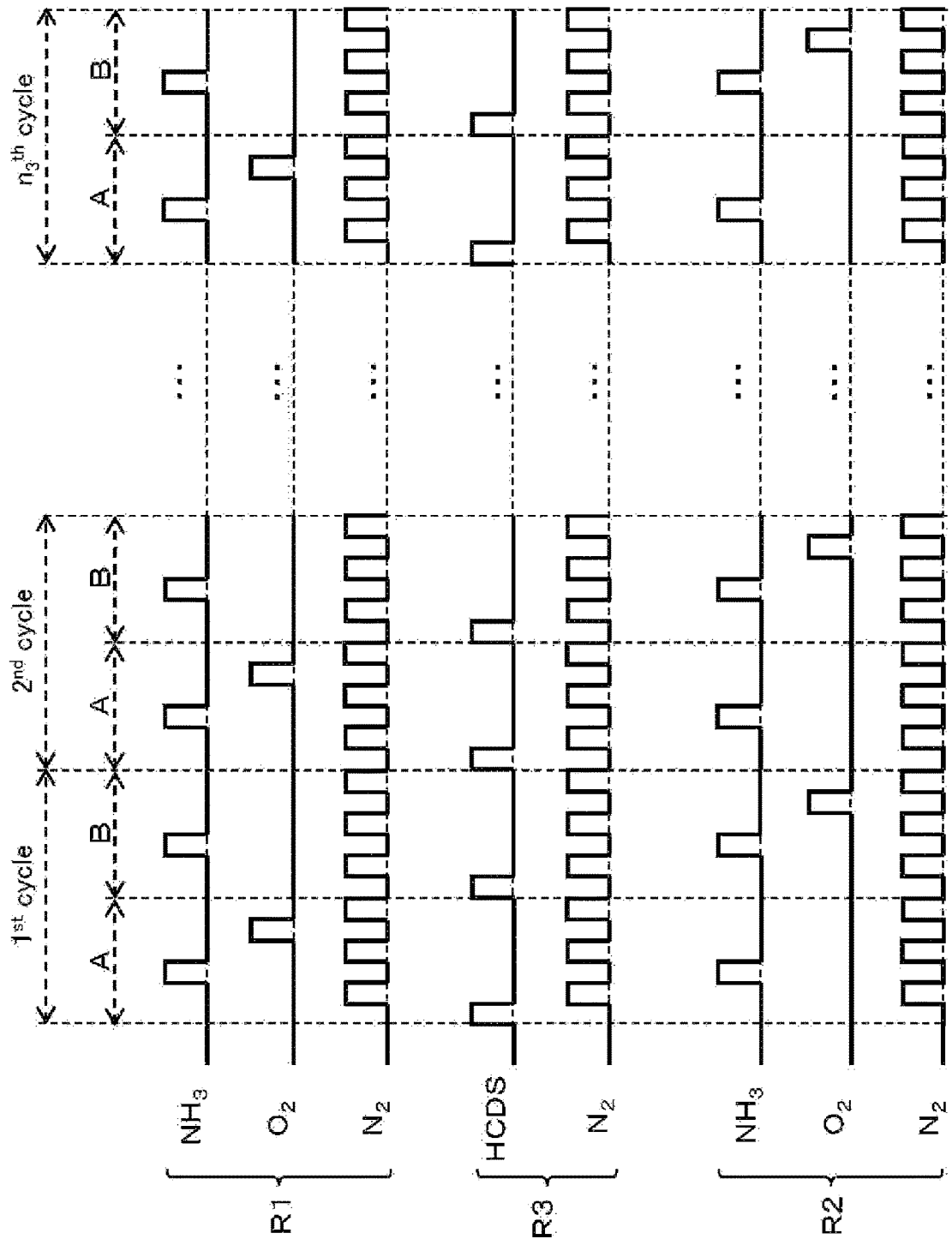
FIG. 6 is a diagram showing a modification of a film-forming sequence according to embodiments of the present disclosure.

FIG. 4 shows an example in which the number of times ($n_1$) of performing the first set performed in the first film-forming step is one and the number of times ($n_2$) of performing the second set performed in the second film-forming step is one. Further, in FIG. 4, a performance period of the first film-forming step and a performance period of the second film-forming step are represented by A and B, respectively, for the sake of convenience. Further, in FIG. 4, the nozzles 249a to 249c are represented by R1 to R3, respectively, for the sake of convenience. The same notations of performance period of each step and each nozzle are used in in FIGS. 5 and 6 showing gas supply sequences of modifications to be described below. Further, in FIG. 4, the performance periods of the steps A1, A2, B1, and B2 are represented as A1, A2, B1, and B2, respectively, for the sake of convenience. The same applies to FIG. 5 to be described below.

In the present disclosure, for the sake of convenience, the film-forming sequence shown in FIG. 4 may be denoted as follows. The same denotations are used in modifications to be described below.

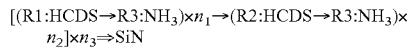

[(R1:HCDS→R3:NH$_3$)×$n_1$→(R2:HCDS→R3:NH$_3$)× $n_2$]×$n_3$⇒SiN

When the term "wafer" is used in the present disclosure, it may refer to "a wafer itself" or "a wafer and a laminated body of certain layers or films formed on a surface of the wafer." When the phrase "a surface of a wafer" is used in the present disclosure, it may refer to "a surface of a wafer itself" or "a surface of a certain layer and the like formed on a wafer". When the expression "a certain layer is formed on a wafer" is used in the present disclosure, it may mean that "a certain layer is formed directly on a surface of a wafer itself" or that "a certain layer is formed on a layer and the like formed on a wafer." When the term "substrate" is used in the present disclosure, it may be synonymous with the term "wafer."

(Wafer Charging and Boat Loading)

The boat 217 is charged with a plurality of wafers 200 (wafer charging). Thereafter, as illustrated in FIG. 1, the boat 217 charged with the plurality of wafers 200 is lifted up by the boat elevator 115 to be loaded into the process chamber 201 (boat loading). In this state, the seal cap 219 seals a lower end of the manifold 209 via the O-ring 220b.

(Pressure Regulation and Temperature Regulation)

The interior of the process chamber 201, that is, a space where the wafers 200 are placed, is vacuum-exhausted (decompression-exhausted) by the vacuum pump 246 to reach a desired pressure (processing pressure). In this operation, the internal pressure of the process chamber 201 is measured by the pressure sensor 245, and the APC valve 244 is feedback-controlled based on the measured pressure information. Further, the wafers 200 in the process chamber 201 are heated by the heater 207 to have a desired temperature (processing temperature). In this operation, a degree of supplying electric power to the heater 207 is feedback-controlled based on the temperature information detected by the temperature sensor 263 so that the interior of the process chamber 201 has a desired temperature distribution. Further, the rotation of the wafers 200 by the rotation mechanism 267 begins. The exhaust of the interior of the process chamber 201 and the heating and rotation of the wafers 200 are continuously performed at least until the processing on the wafers 200 is completed.

(Film-Forming Step)

Then, the following first and second film-forming steps are sequentially performed.

[First Film-Forming Step]

In a first film-forming step, the following steps A1 and A2 are sequentially performed.

[Step A1]

In this step, a HCDS gas is supplied to the wafers 200 in the process chamber 201 (first HCDS gas supplying step). Specifically, the valve 243a is opened to allow the HCDS gas to flow into the gas supply pipe 232a. The flow rate of the HCDS gas is regulated by the MFC 241a, and the HCDS gas is supplied into the process chamber 201 via each of the plurality of gas ejecting holes 250a formed on the side surface of the nozzle 249a and is exhausted via the exhaust port 231a. At this time, at least one selected from the group of the valves 243f to 243h may be opened to allow a N$_2$ gas to be supplied into the process chamber 201 via at least one selected from the group of the nozzles 249a to 249c.

A process condition in this step is exemplified as follows:
HCDS gas supply flow rate: 0.01 to 2 slm, specifically 0.1 to 1 slm
N$_2$ gas supply flow rate (per gas supply pipe): 0 to 10 slm
Each gas supply time: 1 to 120 seconds, specifically 1 to 60 seconds
Processing temperature: 250 to 800 degrees C., specifically 400 to 700 degrees C.
Processing pressure: 1 to 2,666 Pa, specifically 67 to 1,333 Pa.

In the present disclosure, a notation of a numerical range such as "250 to 800 degrees C." means that a lower limit value and an upper limit value are included in the range. For example, "250 to 800 degrees C." means "equal to or higher than 250 degrees C. and equal to or lower than 800 degrees C." The same applies to other numerical ranges.

By supplying the HCDS gas to the wafer 200 under the above-mentioned condition, a Si-containing layer containing Cl is formed on the outermost surface of the wafer 200. The Si-containing layer containing Cl is formed by depositing Si on the outermost surface of the wafer 200, and the like when HCDS is physically adsorbed, when a substance (hereinafter, Si$_x$Cl$_y$) obtained when a portion of HCDS is decomposed is chemically adsorbed, or when HCDS is thermally decomposed. The Si-containing layer containing Cl may be an adsorption layer of HCDS or Si$_x$Cl$_y$ (physisorption layer or chemisorption layer) or a Si layer containing Cl (Si deposition layer). In the present disclosure, the Si-containing layer containing Cl is also simply referred to as a Si-containing layer.

After the Si-containing layer is formed, the valve 243a is closed to stop the supply of the HCDS gas into the process chamber 201. Then, the interior of the process chamber 201 is vacuum-exhausted to remove a gas and the like remaining in the process chamber 201 from the interior of the process chamber 201 (purge step). At this time, the valves 243f to 243h are opened to allow a $N_2$ gas to be supplied into the process chamber 201. The $N_2$ gas acts as a purge gas.

As the precursor (precursor gas), in addition to the HCDS gas, it may be possible to use, for example, a chlorosilane-based gas such as a monochlorosilane ($SiH_3Cl$, abbreviation: MCS) gas, a dichlorosilane ($SiH_2Cl_2$, abbreviation: DCS) gas, a trichlorosilane ($SiHCl_3$, abbreviation: TCS) gas, a tetrachlorosilane ($SiCl_4$, abbreviation: STC) gas, and an octachlorotrisilane ($Si_3Cl_8$, abbreviation: OCTS) gas. The same applies to the step B1 to be described below.

As the inert gas, in addition to the $N_2$ gas, a rare gas such as an Ar gas, a He gas, a Ne gas, and a Xe gas may be used. The same applies to each step to be described below.

[Step A2]

After the step A1 is completed, a $NH_3$ gas is supplied to the wafer 200 in the process chamber 201, that is, the Si-containing layer formed on the wafer 200 (first $NH_3$ gas supplying step). Specifically, the valve 243c is opened to allow the $NH_3$ gas to flow into the gas supply pipe 232c. The flow rate of the $NH_3$ gas is regulated by the MFC 241c, and the $NH_3$ gas is supplied into the process chamber 201 via each of the plurality of gas ejecting holes 250c formed on the side surface of the nozzle 249c and is exhausted via the exhaust port 231a. In this operation, the $NH_3$ gas is supplied to the wafer 200. At this time, at least one selected from the group of the valves 243f to 243h may be opened to allow a $N_2$ gas to be supplied into the process chamber 201 via at least one selected from the group of the nozzles 249a to 249c.

A process condition in this step is exemplified as follows:
$NH_3$ gas supply flow rate: 0.1 to 10 slm
$N_2$ gas supply flow rate (per gas supply pipe): 0 to 2 slm
$NH_3$ gas supply time: 1 to 120 seconds, specifically 1 to 60 seconds
Processing pressure: 1 to 4,000 Pa, specifically 1 to 3,000 Pa.
Other process conditions are the same as the process conditions in the step A1.

By supplying the $NH_3$ gas to the wafer 200 under the above-mentioned condition, at least a portion of the Si-containing layer formed on the wafer 200 is nitrided (modified). When the Si-containing layer is modified, a layer containing Si and N, that is, a SiN layer, is formed on the wafer 200. When the SiN layer is formed, impurities such as Cl contained in the Si-containing layer constitute a gaseous substance containing at least Cl in the process of modifying the Si-containing layer with the $NH_3$ gas and is discharged from the process chamber 201. As a result, the SiN layer becomes a layer having impurities such as Cl fewer than those in the Si-containing layer.

After the SiN layer is formed, the valve 243c is closed to stop the supply of the $NH_3$ gas into the process chamber 201. Then, according to the same process procedure as that in the purge step of the step A1, a gas and the like remaining in the process chamber 201 are removed from the inside of the process chamber 201 (purge step).

As the reactant (reaction gas), in addition to the $NH_3$ gas, for example, a hydrogen nitride-based gas such as diazene ($N_2H_2$) gas, a hydrazine ($N_2H_4$) gas, and a $N_3H_8$ gas may be used. This same applies to the step B2 to be described below.

[Performing First Set Predetermined Number of Times]

By performing a first set a predetermined number of times ($n_1$ time, where $n_1$ is an integer of 1 or more), the first set including non-simultaneously, that is, without synchronization, performing the steps A1 and A2 described above, a first SiN film having a predetermined composition and a predetermined film thickness can be formed on the wafer 200.

[Second Film-Forming Step]

After the first film-forming step is completed, the following steps B1 and B2 are sequentially performed.

[Step B1]

In this step, the HCDS gas is supplied to the wafer 200 in the process chamber 201, that is, the first SiN film formed on the wafer 200 (second HCDS gas supplying step). Specifically, the valve 243b is opened to allow the HCDS gas to flow into the gas supply pipe 232b. The flow rate of the HCDS gas is regulated by the MFC 241b, and the HCDS gas is supplied into the process chamber 201 via each of the plurality of gas ejecting holes 250b formed on the side surface of the nozzle 249b and is exhausted via the exhaust port 231a. Other process procedures are the same as those in the step A1. A process condition in this step is the same as the process condition in the step A1.

By supplying the HCDS gas to the wafer 200 under the above-mentioned condition, as in the step A1, a Si-containing layer is formed on the outermost surface of the wafer 200, that is, on the first SiN film formed on the wafer 200.

After the Si-containing layer is formed, the valve 243b is closed to stop the supply of the HCDS gas into the process chamber 201. Then, according to the same process procedure as that in the purge step of the step A1, a gas and the like remaining in the process chamber 201 are removed from the interior of the process chamber 201 (purge step).

[Step B2]

After the step B1 is completed, according to the same process procedures as that in the step A2, a $NH_3$ gas is supplied to the wafer 200 in the process chamber 201, that is, the Si-containing layer formed on the first SiN film on the wafer 200 (second $NH_3$ gas supplying step). The process condition in this step is the same as the process condition in the step A2.

By supplying the $NH_3$ gas to the wafer 200 under the above-mentioned conditions, at least a portion of the Si-containing layer formed on the first SiN film on the wafer 200 is modified (nitrided), and as in the step A2, a SiN layer is formed on the outermost surface of the wafer 200, that is, on the first SiN film formed on the wafer 200

After the SiN layer is formed, the valve 243c is closed to stop the supply of the $NH_3$ gas into the process chamber 201. Then, according to the same process procedure as that in the purge step of the step A1, a gas and the like remaining in the process chamber 201 are removed from the process chamber 201 (purge step).

[Performing Second Set Predetermined Number of Times]

By performing a second set a predetermined number of times ($n_2$ time, where $n_2$ is an integer of 1 or more), the second set including non-simultaneously, that is, without synchronization, performing the steps B1 and B2 described above, a second SiN film having a predetermined composition and a predetermined film thickness can be formed on the wafer 200, that is, on the first SiN film on the wafer 200.

[Performing Cycle Predetermined Number of Times]

By performing a cycle a predetermined number of times ($n_3$ time, where $n_3$ is an integer of 1 or more), the cycle including non-simultaneously, that is, without synchronization, performing the first and second steps described above, a SiN film having a predetermined composition and a predetermined film thickness and including a laminated film in which the first SiN film and the second SiN film are alternately laminated can be formed on the wafer 200.

(After-Purge and Returning to Atmospheric Pressure)

After the film-forming step is completed, a $N_2$ gas is supplied into the process chamber 201 from each of the gas supply pipes 232f to 232h and is exhausted from the exhaust pipe 231 via the exhaust port 231a. The $N_2$ gas acts as a purge gas. Thus, the interior of the process chamber 201 is purged and a gas and reaction byproducts remaining in the process chamber 201 are removed from the interior of the process chamber 201 (after-purge). Thereafter, the internal atmosphere of the process chamber 201 is substituted with an inert gas (inert gas substitution) and the internal pressure of the process chamber 201 is returned to the atmospheric pressure (returning to atmospheric pressure).

(Boat Unloading and Wafer Discharging)

The seal cap 219 is moved down by the boat elevator 115 to open the lower end of the manifold 209. Then, the processed wafers 200 supported by the boat 217 are unloaded from the lower end of the manifold 209 to the outside of the reaction tube 203 (boat unloading). The processed wafers 200 are unloaded to the outside of the reaction tube 203, and then are subsequently discharged from the boat 217 (wafer discharging).

(3) Effects of the Present Embodiment

According to the present embodiment, one or more effects set forth below may be achieved.

(a) By supplying the HCDS gas to the wafer 200 from the nozzle 249a in the step A1 of the first film-forming step and supplying the HCDS gas to the wafer 200 from the nozzle 249b having the structure different from that of the nozzle 249a in the step B1 of the second film-forming step, it is possible to control the inter-wafer film thickness distribution of the SiN film (laminated film) formed on the wafer 200.

This is because, in the step A1, the HCDS gas is supplied to the wafer 200 from each of the gas ejecting holes 250a configured such that the opening area gradually decreases from the lower side toward the upper side of the wafer arrangement region. In the step A1, the flow rate of the HCDS gas supplied to the wafer 200 decreases from one end toward the other end thereof of the wafer arrangement region in the wafer arrangement direction, that is, from the lower side toward the upper side of the wafer arrangement region, and therefore a flow velocity of the HCDS gas on the surface of the wafer 200 decreases, which increases a residence time of the HCDS gas on the surface of the wafer 200. In the step A1, an amount of adsorption of Si contained in the HCDS gas on the surface of the wafer 200 increases from the lower side toward the upper side of the wafer arrangement region, which increases the thickness of the Si-containing layer formed on the wafer 200. As a result, the inter-wafer film thickness distribution of the first SiN film formed on the wafer 200 by performing the first film-forming step is a distribution in which the film thickness gradually increases from the lower side toward the upper side of the wafer arrangement region.

Further, in the step B1, the HCDS gas is supplied to the wafer 200 from each of the gas ejecting holes 250b configured such that the opening area gradually increases from the lower side toward the upper side of the wafer arrangement region. In the step B1, the flow rate of the HCDS gas supplied to the wafer 200 increases from one end toward the other end of the wafer arrangement region in the wafer arrangement direction, that is, from the lower side toward the upper side of the wafer arrangement region, and therefore the flow velocity of the HCDS gas on the surface of the wafer 200 increases, which decreases the residence time of the HCDS gas on the surface of the wafer 200. In the step B1, the amount of adsorption of Si contained in the HCDS gas on the surface of the wafer 200 decreases from the lower side toward the upper side of the wafer arrangement region, which decreases the thickness of the Si-containing layer formed on the wafer 200. As a result, the inter-wafer film thickness distribution of the second SiN film formed on the wafer 200 by performing the second film-forming step is a distribution in which the film thickness gradually decreases from the lower side toward the upper side of the wafer arrangement region.

In a case where the SiN film is formed on the wafer 200 by repeatedly laminating the first SiN film by performing only the first film-forming step a plurality of times while not performing the second film-forming step, the inter-wafer film thickness distribution of the SiN film formed on the wafer 200 becomes a distribution in which the film thickness gradually increases from the lower side toward the upper side of the wafer arrangement region. Further, in a case where the SiN film is formed on the wafer 200 by repeatedly laminating the second SiN film by performing only the second film-forming step a plurality of times while not performing the first film-forming step, the inter-wafer film thickness distribution of the SiN film formed on the wafer 200 becomes a distribution in which the film thickness gradually decreases from the lower side to the upper side of the wafer arrangement region.

In contrast, in the present embodiment, by alternately laminating the first and second SiN films having different inter-wafer film thickness distributions on the wafer 200 by performing a cycle a predetermined number of times, the cycle including non-simultaneously performing the first and second film-forming steps, it is possible to control the inter-wafer film thickness distribution of the SiN film formed on the wafer 200. That is, it is possible to set the inter-wafer film thickness distribution of the SiN film formed on the wafer 200 to an intermediate distribution between the inter-wafer film thickness distribution of the SiN film formed on the wafer 200 by performing only the first film-forming step the predetermined number of times and the inter-wafer film thickness distribution of the SiN film formed on the wafer 200 by performing only the second film-forming step the predetermined number of times.

For example, by setting a ratio of a total film thickness of the first SiN film included in the SiN film to a total film thickness of the second SiN film included in the SiN film to a predetermined value, it is possible to have the inter-wafer film thickness distribution of the SiN film formed on the wafer 200 such that the thickness of the SiN film becomes uniform from the lower side to the upper side of the wafer arrangement region. That is, it is possible to improve the inter-wafer film thickness uniformity of the SiN film formed on the wafer 200.

Further, for example, by setting the ratio of the total film thickness of the first SiN film included in the SiN film to the total film thickness of the second SiN film included in the SiN film to be larger than the above-mentioned ratio when the inter-wafer film thickness distribution is uniform, it is possible to control the inter-wafer film thickness distribution of the SiN film formed on the wafer 200 to approach the inter-wafer film thickness distribution of the SiN film formed on the wafer 200 by performing only the first film-forming step a plurality of times.

Further, for example, by setting the ratio of the total film thickness of the first SiN film included in the SiN film to the total film thickness of the second SiN film included in the SiN film to be smaller than the above-mentioned ratio when the inter-wafer film thickness distribution is uniform, it is possible to control the inter-wafer film thickness distribution of the SiN film formed on the wafer 200 to approach the inter-wafer film thickness distribution of the SiN film formed on the wafer 200 by performing only the second film-forming step a plurality of times.

(b) Since at least a portion of the installation region of the gas ejecting holes 250a in the nozzle 249a and at least a portion of the installation region of the gas ejecting holes 250b in the nozzle 249b overlap each other in the wafer arrangement direction, the above-mentioned effects can be obtained over a wide range of the wafer arrangement region in the wafer arrangement direction. In particular, as in the present embodiment, the entire installation regions of the gas ejecting holes 250a to 250c in the nozzles 249a to 249c overlap one another in the wafer arrangement direction, whereby the above-mentioned effects can be obtained in a wider range of the wafer arrangement region in the wafer arrangement direction, for example, in the entire region extending from the lower side to the upper side of the wafer arrangement region.

(c) By controlling the number of times ($n_1$) of performing the first set in the first film-forming step, it is possible to control a degree of the inter-wafer film thickness distribution of the first SiN film formed on the wafer 200 over a wide range. For example, by setting $n_1$ to a large value, it is possible to increase the degree of the inter-wafer film thickness distribution in which the film thickness of the first SiN film gradually increases from the lower side toward the upper side of the wafer arrangement region. This control may be effective in a reaction system in which the SiN film formed on the wafer 200 tends to become thinner from the lower side toward the upper side of the wafer arrangement region. Further, by setting $n_1$ to a small value, it is possible to decrease the degree of the inter-wafer film thickness distribution in which the film thickness of the first SiN film gradually increases from the lower side toward the upper side of the wafer arrangement region.

Further, by controlling the number of times ($n_2$) of performing the second set in the second film-forming step, it is possible to control the degree of the inter-wafer film thickness distribution of the second SiN film formed on the wafer 200 over a wide range. For example, by setting $n_2$ to a large value, it is possible to increase the degree of the inter-wafer film thickness distribution in which the film thickness of the second SiN film gradually decreases from the lower side to the upper side of the wafer arrangement region. This control may be effective in a reaction system in which the SiN film formed on the wafer 200 tends to become thicker from the lower side toward the upper side of the wafer arrangement region. Further, by setting $n_2$ to a small value, it is possible to decrease the degree of the inter-wafer film thickness distribution in which the film thickness of the second SiN film gradually decreases from the lower side toward the upper side of the wafer arrangement region.

From these points, by controlling the number of times ($n_1$) of performing the first set in the first film-forming step and the number of times ($n_2$) of performing the second set in the second film-forming step respectively, that is, by setting $n_1=n_2$, $n_1>n_2$, $n_1>>n_2$, $n_1<n_2$, or $n_1<<n_2$, it is possible to control the degree of the inter-wafer film thickness distribution of the SiN film finally formed on the wafer 200 over a wide range.

(d) The above-mentioned effects can be similarly obtained even when the above-mentioned precursor other than the HCDS gas is used, when the above-mentioned reactant other than the $NH_3$ gas is used, or when the above-mentioned inert gas other than the $N_2$ gas is used.

(4) Modifications

The present embodiment can be changed as in the following modifications. These modifications may be used in proper combination. Unless otherwise specified, a process condition and a process procedure in each step of each modification may be the same as the process condition and process procedure in each step of the film-forming sequence shown in FIG. 4.

(Modification 1)

As illustrated in FIG. 7B, long nozzles configured to extend upward in the wafer arrangement direction from the lower portion to the upper portion of the inner wall of the reaction tube 203 may be used as the nozzles 249a to 249c.

Further, in this modification, the opening areas of the plurality of gas ejecting holes 250a formed on the side surface of the nozzle 249a decrease gradually from one end toward the other end of the wafer arrangement region in the wafer arrangement direction (here, from the lower side toward the upper side of the wafer arrangement region). Further, the opening areas of the plurality of gas ejecting holes 250b formed on the side surface of the nozzle 249b increase gradually from the one end toward the other end of the wafer arrangement region in the wafer arrangement direction (here, from the lower side toward the upper side of the wafer arrangement region). Further, the opening areas of the plurality of gas ejecting holes 250c formed on the side surface of the nozzle 249c have a uniform size from the one end to the other end of the wafer arrangement region in the wafer arrangement direction (here, from the lower side to the upper side of the wafer arrangement region). In this modification, the lower side of the wafer arrangement region corresponds to an upstream side of gas flow in the nozzles 249a to 249c and a downstream side of gas flow in the process chamber 201, and the upper side of the wafer arrangement region corresponds to a downstream side of the gas flow in the nozzles 249a to 249c and an upstream side of the gas flow in the process chamber 201.

Further, in this modification, the entire installation regions of the gas ejecting holes 250a to 250c in the nozzles 249a to 249c overlap one another in the wafer arrangement direction. The gas ejecting holes 250a having the opening area set to be large in the nozzle 249a and the gas ejecting holes 250b having the opening area set to be small in the nozzle 249b are respectively arranged at the height positions corresponding to each other in the wafer arrangement region, that is, at the height positions corresponding to each other (similar height positions) on the lower side of the wafer arrangement region. Further, the gas ejecting holes 250a having the opening area set to be small in the nozzle 249a and the gas ejecting holes 250b having the opening area set to be large in the nozzle 249b are respectively arranged at the height positions corresponding to each other in the wafer arrangement region, that is, at the height positions corresponding to each other (similar height positions) on the upper side the wafer arrangement region.

Further, in this modification, the same effects as those obtained when the nozzles 249a to 249c illustrated in FIG. 7A are used can be obtained.

(Modification 2)

As illustrated in FIG. 8A, each of the plurality of gas ejecting holes 250a to 250c formed on the side surfaces of the nozzles 249a to 249c may be formed in a slit shape. That is, the first to third ejecting holes may have a shape including a slit shape.

Further, in this modification, the opening areas of the plurality of gas ejecting holes 250a formed on the side surface of the nozzle 249a decrease gradually from one end toward the other end of the wafer arrangement region in the wafer arrangement direction (here, from the lower side toward the upper side of the wafer arrangement region). Further, the opening areas of the plurality of gas ejecting holes 250b formed on the side surface of the nozzle 249b increase gradually from the one end toward the other end of the wafer arrangement region in the wafer arrangement direction (here, from the lower side toward the upper side of the wafer arrangement region). Further, the opening areas of the plurality of gas ejecting holes 250c formed on the side surface of the nozzle 249c have a uniform size from the one end to the other end of the wafer arrangement region in the wafer arrangement direction (here, from the lower side to the upper side of the wafer arrangement region). In this modification, the lower side of the wafer arrangement region corresponds to the downstream sides of gas flows in the nozzles 249a to 249c and the process chamber 201, and the upper side of the wafer arrangement region corresponds to the upstream sides of gas flows in the nozzles 249a to 249c and the process chamber 201.

Further, in this modification, the entire installation regions of the gas ejecting holes 250a to 250c in the nozzles 249a to 249c overlap each other in the wafer arrangement direction. The gas ejecting holes 250a having the opening area set to be large in the nozzle 249a and the gas ejecting holes 250b having the opening area set to be small in the nozzle 249b are respectively arranged at the height positions corresponding to each other in the wafer arrangement region, that is, at the height positions corresponding to each other (similar height positions) on the lower side of the wafer arrangement region. Further, the gas ejecting holes 250a having the opening area set to be small in the nozzle 249a and the gas ejecting holes 250b having the opening area set to be large in the nozzle 249b are respectively arranged at the height positions corresponding to each other in the wafer arrangement region, that is, at the height positions corresponding to each other (similar height positions) on the upper side of the wafer arrangement region.

Further, in this modification, one of (i) the gas ejecting holes 250a in the nozzle 249a and (ii) the gas ejecting holes 250b in the nozzle 249b may have a shape including a slit shape, and the other one different from the one of (i) and (ii) may have a shape including a circular shape.

Further, in this modification, the same effects as those obtained when the nozzles 249a to 249c illustrated in FIG. 7A are used can be obtained.

(Modification 3)

As illustrated in FIG. 8B, long nozzles configured to extend upward in the wafer arrangement direction from the lower portion to the upper portion of the inner wall of the reaction tube 203 may be used as the nozzles 249a to 249c, and each of the gas ejecting holes 250a to 250c may be formed in the slit shape.

Further, in this modification, the opening areas of the plurality of gas ejecting holes 250a formed on the side surface of the nozzle 249a decrease gradually from one end toward the other end of the wafer arrangement region in the wafer arrangement direction (here, from the lower side toward the upper side of the wafer arrangement region). Further, the opening areas of the plurality of gas ejecting holes 250b formed on the side surface of the nozzle 249b increase gradually from the one end toward the other end of the wafer arrangement region in the wafer arrangement direction (here, from the lower side toward the upper side of the wafer arrangement region). Further, the opening areas of the plurality of gas ejecting holes 250c formed on the side surface of the nozzle 249c are not particularly limited, but for example, the opening area have a uniform size from the one end to the other end of the wafer arrangement region in the wafer arrangement direction (here, from the lower side toward the upper side of the wafer arrangement region).

Further, in this modification, the entire installation regions of the gas ejecting holes 250a to 250c in the nozzles 249a to 249c overlap each other in the wafer arrangement direction. The gas ejecting holes 250a having the opening area set to be large in the nozzle 249a and the gas ejecting holes 250b having the opening area set to be small in the nozzle 249b are respectively arranged at the height positions corresponding to each other in the wafer arrangement region, that is, at the height positions corresponding to each other (similar height positions) on the lower side of the wafer arrangement region. Further, the gas ejecting holes 250a having the opening area set to be small in the nozzle 249a and the gas ejecting holes 250b having the opening area set to be large in the nozzle 249b are respectively arranged at the height positions corresponding to each other in the wafer arrangement region, that is, at the height positions corresponding to each other (similar height positions) on the upper side of the wafer arrangement region.

Further, in this modification, one of (i) the gas ejecting holes 250a in the nozzle 249a and (ii) the gas ejecting holes 250b in the nozzle 249b may have a shape including a slit shape, and the other one different from the one of (i) and (ii) may have a shape including a circular shape.

Further, in this modification, the same effects as those obtained when the nozzles 249a to 249c illustrated in FIG. 7A are used can be obtained.

(Modification 4)

The opening areas of the plurality of gas ejecting holes 250a formed on the side surface of the nozzle 249a may decrease gradually from one end toward the other end of the wafer arrangement region in the wafer arrangement direction (here, from the lower side toward the upper side of the wafer arrangement region), like the opening areas of the gas ejecting holes 250a in the nozzle 249a illustrated in FIGS. 7A, 7B, 8A, and 8B, and the opening areas of the plurality of gas ejecting holes 250b and 250c formed on the side surfaces of the nozzles 249b and 249c may have a uniform size from the one end toward the other end side of the wafer arrangement region in the wafer arrangement direction (here, from the lower side toward the upper side of the wafer arrangement region), like the opening areas of the gas ejecting holes 250c in the nozzle 249c illustrated in FIGS. 7A, 7B, 8A, and 8B.

Further, for example, the opening areas of the plurality of gas ejecting holes 250b formed on the side surface of the nozzle 249b may increase gradually from the one end toward the other end of the wafer arrangement region in the wafer arrangement direction (here, from the lower side toward the upper side of the wafer arrangement region), like the opening areas of the gas ejecting holes 250b in the nozzle 249b illustrated in FIGS. 7A, 7B, 8A, and 8B, and the opening areas of the plurality of gas ejecting holes 250a and 250c formed on the side surfaces of the nozzles 249a and 249c may have a uniform size from the one end to the other end of the wafer arrangement region in the wafer arrangement direction (here, from the lower side toward the upper side thereof of the wafer arrangement region), like the opening areas of the gas ejecting holes 250c in the nozzle 249c illustrated in FIGS. 7A, 7B, 8A, and 8B.

Further in this modification, the same effects as those obtained when the nozzles 249a to 249c illustrated in FIG. 7A are used can be obtained.

(Modification 5)

As in a film-forming sequence shown in FIG. 5 and below, in each of the steps A2 and B2, an $O_2$ gas may be supplied to the wafer 200 from the nozzles 249c, and a $H_2$ gas may be supplied to the wafer 200 from the nozzles 249a and 249b. The $H_2$ gas may be supplied from at least one selected from the group of the nozzles 249a and 249b. The steps A1 and B1 are performed in the same manner as the steps A1 and B1 of the film-forming sequence shown in FIG. 4.

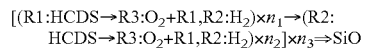

According to this modification, a film containing Si and O, that is, a silicon oxide film (SiO film), may be formed as a film on the wafer 200. Further, in this modification, the same effects as those of the film-forming sequence shown in FIG. 4 can be obtained.

(Modification 6)

The configuration of the gas supply system may be changed to supply a HCDS gas to the wafer 200 from the gas supply pipe 232c and supply a $NH_3$ gas and an $O_2$ gas to the wafer 200 from the gas supply pipes 232a and 232b, respectively.

Then, as in a film-forming sequence shown in FIG. 6 and below, in the first film-forming step, a first set may be performed a predetermined number of times ($n_1$ time, where $n_1$ is an integer of 1 or more), and the first set may include non-simultaneously performing: a step of supplying a HCDS gas to the wafer 200 from the nozzle 249c; a step of supplying a $NH_3$ gas to the wafer 200 from the nozzles 249a and 249b; and a step of supplying an $O_2$ gas to the wafer 200 from the nozzle 249a. Further, in the second film-forming step, a second set may be performed a predetermined number of times ($n_2$ time, where $n_2$ is an integer of 1 or more), and the second set may include non-simultaneously performing: a step of supplying a HCDS gas to the wafer 200 from the nozzle 249c; a step of supplying a $NH_3$ gas to the wafer 200 from the nozzles 249a and 249b; and a step of supplying an $O_2$ gas to the wafer 200 from the nozzle 249b. The $NH_3$ gas may be supplied from at least one selected from the group of the nozzles 249a and 249b.

By performing the first film-forming step, a film containing Si, O, and N, that is, a first SiON film, may be formed on the wafer 200. Further, by performing the second film-forming step, a film containing Si, O, and N, that is, a second SiON film, may be formed on the wafer 200, that is, on the first SiON film on the wafer 200. According to this modification, a SiON film having a predetermined composition and a predetermined film thickness and including a laminated film in which the first SiON film and the second SiON film are alternately laminated can be formed as a film on the wafer 200.

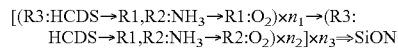

According to this modification, by performing the first film-forming step, it is possible to set an inter-wafer composition distribution of the first SiON film formed on the wafer 200 to a distribution in which the degree of oxidation by the $O_2$ gas gradually increases from the lower side toward the upper side of the wafer arrangement region and a content (residual amount) of N in the film gradually decreases, that is, a composition distribution in which N becomes poorer and poorer from the lower side toward the upper side of the wafer arrangement region. Further, by performing the second film-forming step, it is possible to set an inter-wafer composition distribution of the second SiON film formed on the wafer 200 to a distribution in which the degree of oxidation by the $O_2$ gas gradually decrease from the lower side toward the upper side of the wafer arrangement region and the content (residual amount) of N in the film gradually increases, that is, a composition distribution in which N becomes richer and richer from the lower side toward the upper side of the wafer arrangement region.

In this modification, by alternately laminating the first and second SiON films having different inter-wafer composition distributions on the wafer 200 by performing a cycle a predetermined number of times (the cycle including non-simultaneously performing the first and second film-forming steps), it is possible to control the inter-wafer composition distribution of the SiON film finally formed on the wafer 200. That is, it is possible to set the inter-wafer composition distribution of the SiON film finally formed on the wafer 200 to an intermediate distribution between the inter-wafer composition distribution of the SiON film formed on the wafer 200 by performing only the first film-forming step a predetermined number of times and the inter-wafer composition distribution of the SiON film formed on the wafer 200 by performing only the second film-forming step a predetermined number of times.

For example, by setting a ratio of a total film thickness of the first SiON film included in the SiON film to a total film thickness of the second SiON film included in the SiON film to a predetermined value, it is possible to make the inter-wafer composition distribution of the SiON film formed on the wafer 200 uniform from the lower side to the upper side of the wafer arrangement region. That is, it is possible to improve the inter-wafer composition uniformity of the SiON film formed on the wafer 200.

Further, for example, by setting the ratio of the total film thickness of the first SiON film included in the SiON film to the total film thickness of the second SiON film included in the SiON film to be larger than the above-mentioned ratio when the inter-wafer composition distribution is uniform, it is possible to control the inter-wafer composition distribution of the SiON film formed on the wafer 200 to approach the inter-wafer composition distribution of the SiON film formed on the wafer 200 by performing only the first film-forming step a predetermined number of times.

Further, for example, by setting the ratio of the total film thickness of the first SiON film included in the SiON film to the total film thickness of the second SiON film included in the SiON film to be smaller than the above-mentioned ratio when the inter-wafer composition distribution is uniform, it is possible to control the inter-wafer composition distribution of the SiON film formed on the wafer 200 to approach the inter-wafer composition distribution of the SiON film formed on the wafer 200 by performing only the second film-forming step a predetermined number of times.

(Modification 7)

As in a film-forming sequence described below, a cycle including non-simultaneously performing a step of simultaneously supplying a HCDS gas to the wafer 200 from the nozzles 249a and 249b; and a step of supplying a $NH_3$ gas to the wafer 200 from the nozzles 249c may be performed a predetermined number of times (n times, where n is an integer of 1 or more). Further, in this modification, the same effects as those of the film-forming sequence shown in FIG. 4 can be obtained. Further, according to this modification, by regulating a flow rate balance of the HCDS gas supplied from the nozzles 249a and 249b, it is possible to control the inter-wafer film thickness distribution in a wide range. Further, a cycle including non-simultaneously performing the first film-forming step of the film-forming sequence shown in FIG. 4, the second film-forming step of the film-forming sequence shown in FIG. 4, and the film-forming sequence of this modification may be performed a predetermined number of times.

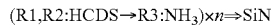
(R1,R2:HCDS→R3:NH$_3$)×$n$⇒SiN

Other Embodiments

The embodiments of the present disclosure have been specifically described above. However, the present disclosure is not limited to the above-described embodiments, but various modifications may be made without departing from the gist thereof.

For example, as the precursor, it may be possible to use, e.g., an aminosilane-based gas such as a tris(dimethylamino)silane (SiH[N(CH$_3$)$_2$]$_3$, abbreviation: 3DMAS) gas and a bis(diethylamino)silane (SiH$_2$[N(C$_2$H$_5$)$_2$]$_2$, abbreviation: BDEAS) gas.

Further, for example, as the reactant, it may be possible to use a carbon (C)-containing gas such as a propylene (C$_3$H$_6$) gas, a gas containing N and C such as a triethylamine ((C$_2$H$_5$)$_3$N, abbreviation: TEA) gas, a boron (B)-containing gas such as a trichloroborane (BCl$_3$) gas, or an O-containing gas such as an ozone (O$_3$) gas and a plasma-excited oxygen (O$_2$) gas (O$_2$*).

Then, for example, according to film-forming sequences described below, the present disclosure may also be applied to a case of forming a Si-containing film such as a SiON film, a silicon oxycarbide film (SiOC film), a silicon oxycarbonitride film (SiOCN film), a silicon carbonitride film (SiCN film), a silicon borocarbonitride film (SiBCN film), and a silicon boronitride film (SiBN film) on the substrate. Further, in these cases, the same effects as those of the above-described embodiments can be obtained. A process procedure and a process condition when the precursor and the reactants are supplied may be, for example, the same as those in each step of the above-described embodiments.

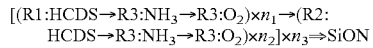
[(R1:HCDS→R3:NH$_3$→R3:O$_2$)×$n_1$→(R2: HCDS→R3:NH$_3$→R3:O$_2$)×$n_2$]×$n_3$⇒SiON

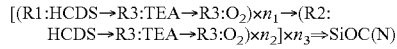
[(R1:HCDS→R3:TEA→R3:O$_2$)×$n_1$→(R2: HCDS→R3:TEA→R3:O$_2$)×$n_2$]×$n_3$⇒SiOC(N)

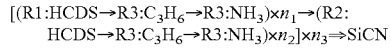
[(R1:HCDS→R3:C$_3$H$_6$→R3:NH$_3$)×$n_1$→(R2: HCDS→R3:C$_3$H$_6$→R3:NH$_3$)×$n_2$]×$n_3$⇒SiCN

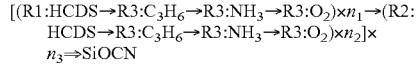
[(R1:HCDS→R3:C$_3$H$_6$→R3:NH$_3$→R3:O$_2$)×$n_1$→(R2: HCDS→R3:C$_3$H$_6$→R3:NH$_3$→R3:O$_2$)×$n_2$]×$n_3$⇒SiOCN

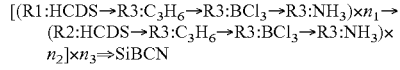
[(R1:HCDS→R3:C$_3$H$_6$→R3:BCl$_3$→R3:NH$_3$)×$n_1$→(R2:HCDS→R3:C$_3$H$_6$→R3:BCl$_3$→R3:NH$_3$)×$n_2$]×$n_3$⇒SiBCN

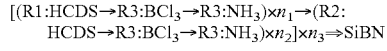
[(R1:HCDS→R3:BCl$_3$→R3:NH$_3$)×$n_1$→(R2: HCDS→R3:BCl$_3$→R3:NH$_3$)×$n_2$]×$n_3$⇒SiBN

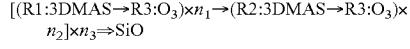
[(R1:3DMAS→R3:O$_3$)×$n_1$→(R2:3DMAS→R3:O$_3$)×$n_2$]×$n_3$⇒SiO

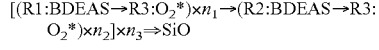
[(R1:BDEAS→R3:O$_2$*)×$n_1$→(R2:BDEAS→R3:O$_2$*)×$n_2$]×$n_3$⇒SiO

Further, for example, the present disclosure may be applied to a case of using a titanium tetrachloride (TiCl$_4$) gas, a trimethylaluminum (Al(CH$_3$)$_3$, abbreviation: TMA) gas, and the like as a precursor to form a film containing a metal element such as a titanium nitride film (TiN film), a titanium oxynitride film (TiON film), a titanium aluminum carbonitride film (TiAlCN film), a titanium aluminum carbide film (TiAlC film), a titanium carbonitride film (TiCN film), and a titanium oxide film (TIO film) on a substrate. Further, in these cases, the same effects as those of the above-described embodiments may be obtained.

Further, for example, the present disclosure may be applied to a case of performing an oxidizing process such as dry oxidation, wet oxidation, or plasma oxidation of a surface of a substrate, or a nitriding process such as thermal nitridation or plasma nitridation of the surface of the substrate. Further, in these cases, the same effects as those of the above-described embodiments can be obtained.

Recipes used in the substrate processing may be provided individually according to the processing contents and may be stored in the memory 121*c* via a telecommunication line or the external memory device 123. Moreover, at the beginning of the substrate processing, the CPU 121*a* may properly select an appropriate recipe from the recipes stored in the memory 121*c* according to the contents of the substrate processing. Thus, it is possible for a single substrate processing apparatus to form films of various kinds, composition ratios, qualities, and thicknesses with enhanced reproducibility. Further, it is possible to reduce an operator's burden and to quickly start the substrate processing while avoiding an operation error.

The recipes described above are not limited to newly-provided ones but may be provided, for example, by modifying existing recipes that are already installed in the substrate processing apparatus. When the recipes are modified, the modified recipes may be installed in the substrate processing apparatus via a telecommunication line or a recording medium recording the recipes. In addition, the existing recipes already installed in the existing substrate processing apparatus may be directly modified by operating the input/output device 122 of the substrate processing apparatus.

Figure 9A:
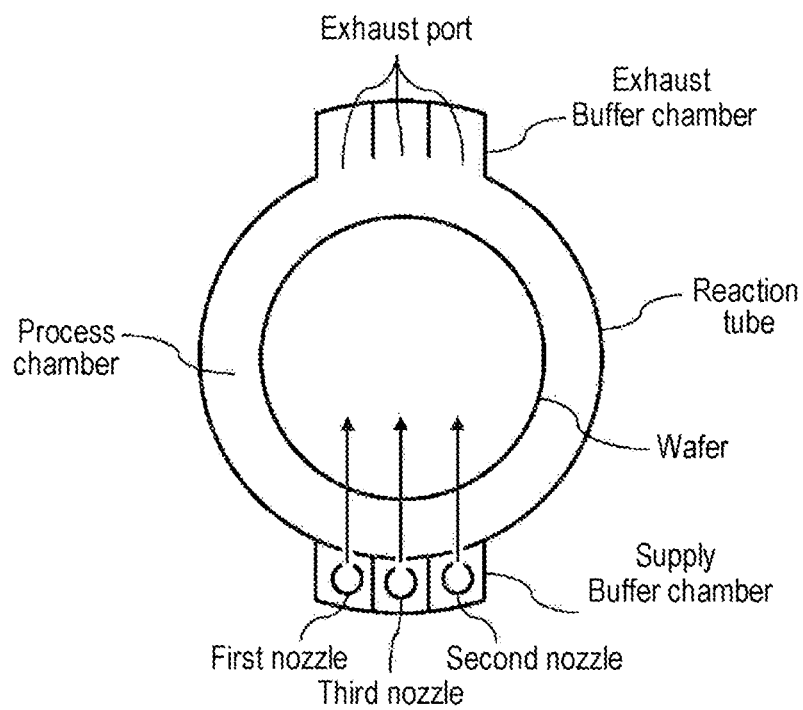
FIGS. 9A and 9B are schematic configuration views of a vertical process furnace of a substrate processing apparatus suitably used in another embodiment of the present disclosure, respectively.
Figure 9B:
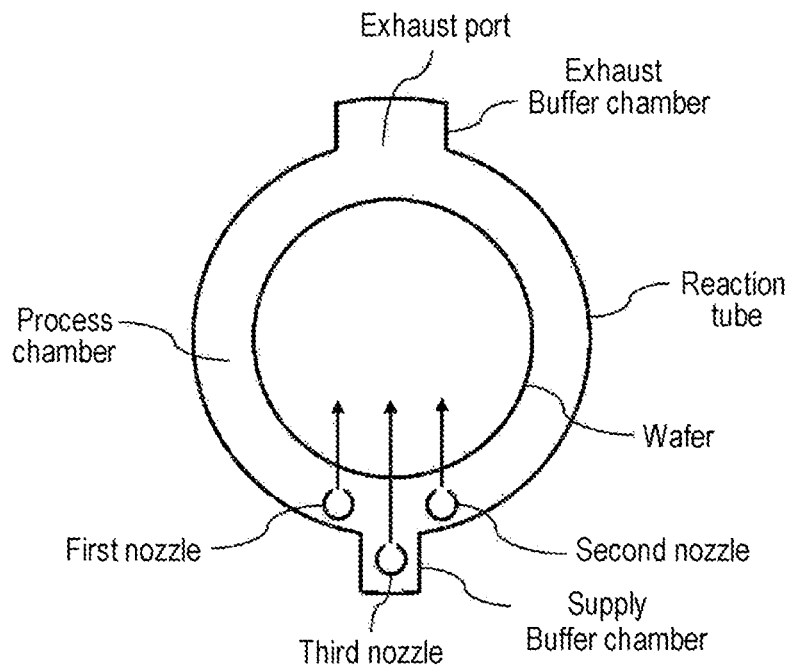

In the above-described embodiments, an example has been described in which the first to third nozzles (the nozzles 249*a* to 249*c*) as the first to third supply parts are provided in the process chamber along the inner wall of the reaction tube. However, the present disclosure is not limited to the above-described embodiments. For example, as illustrated in the cross-sectional structure of the vertical process furnace in FIG. 9A, a buffer chamber is provided at the sidewall of the reaction tube, and the first to third nozzles having the same configurations as the above-described embodiments may be provided in the buffer chamber in the same arrangement as those of the above-described embodiments. FIG. 9A shows an example in which a supply buffer chamber and an exhaust buffer chamber are provided at the sidewall of the reaction tube and are respectively arranged at opposing positions with a wafer interposed therebetween. Each of the supply buffer chamber and the exhaust buffer chamber is provided from the lower portion to the upper portion of the sidewall of the reaction tube, that is, along the wafer arrangement region. Further, FIG. 9A shows an example in which the supply buffer chamber is partitioned into a plurality of (three) spaces and the nozzles are arranged in the space respectively. The arrangement of the three spaces in the buffer chamber is the same as the arrangement of the first to third nozzles. The spaces in which the first to third nozzles are arranged may also be referred to as first to third buffer chambers, respectively. The first nozzle and the first buffer chamber, the second nozzle and the second buffer chamber, and the third nozzle and the third buffer chamber may be considered as a first supply part, a second supply part, and a third supply part, respectively. Further, for example, as illustrated in the cross-sectional structure of the vertical process furnace in FIG. 9B, the buffer chamber may be provided in the same arrangement as that in FIG. 9A, the third nozzle may be provided in the buffer chamber, and the first and second nozzles may be provided along the inner wall of the reaction tube while interposing a communication part of the buffer chamber with the process chamber from both sides. The first nozzle, the second nozzle, and the third nozzle, and the buffer chamber may be considered as the first supply part, the second supply part, and the third supply part, respectively. The configurations other than the buffer chamber and the reaction tube described in FIGS. 9A and 9B are the same as the configurations of the respective parts of the process furnace illustrated in FIG. 1. Even when these process furnaces are used, the same substrate processing as that of the above-described embodiments may be performed, and the same effects as those of the above-described embodiments can be obtained.

The example in which a film is formed by using a batch-type substrate processing apparatus capable of processing a plurality of substrates at a time has been described in the above-described embodiments. The present disclosure is not limited to the above-described embodiments, but may be suitably applied, for example, to a case where a film is formed by using a single-wafer type substrate processing apparatus capable of processing a single substrate or several substrates at a time. In addition, the example in which a film is formed by using a substrate processing apparatus provided with a hot-wall-type process furnace has been described in the above-described embodiments. The present disclosure is not limited to the above-described embodiments, but may be suitably applied to a case where a film is formed by using a substrate processing apparatus provided with a cold-wall-type process furnace.

Even in the case of using these substrate processing apparatuses, substrate processing may be performed according to the same sequences and process conditions as those in the above-described embodiments and modifications, and the same effects as those of the above-described embodiments and modifications can be obtained.

The above-described embodiments and modifications may be used in proper combination. The process procedures and process conditions used in that case may be the same as, for example, the process procedures and process conditions of the above-described embodiments.

EXAMPLES

As Example 1, the substrate processing apparatus illustrated in FIG. 1 is used to form a SiN film on wafers arranged in the process chamber by the film-forming sequence shown in FIG. 4, that is, a film-forming sequence of alternately supplying a HCDS gas to the wafers from the first and second nozzles and supplying a NH$_3$ gas to the wafers from the third nozzle. The first to third nozzles have the shapes of the nozzles illustrated in FIG. 7A.

As Example 2, the substrate processing apparatus used in Example 1 is used to form a SiN film on wafers arranged in the process chamber by the film-forming sequence of the above-described Modification 7, that is, a film-forming sequence of supplying a HCDS gas to the wafers by using simultaneously the first and second nozzles and supplying a NH$_3$ gas to the wafers from the third nozzle.

As Comparative Example 1, the substrate processing apparatus used in Example 1 is used to form a SiN film on wafers by the film-forming sequence of performing only the first film-forming step a plurality of times, among the film-forming sequence shown in FIG. 4, that is, a film-forming sequence of supplying a HCDS gas to the wafers by using only the first nozzle and supplying a NH$_3$ gas to the wafers from the third nozzle.

As Comparative Example 2, the substrate processing apparatus used in Example 1 is used to form a SiN film on wafers by the film-forming sequence of performing only the second film-forming step a plurality of times, among the film-forming sequence shown in FIG. 4, that is, a film-forming sequence of supplying a HCDS gas to the wafers by using only the second nozzle and supplying a NH$_3$ gas to the wafers from the third nozzle.

Figure 10A:
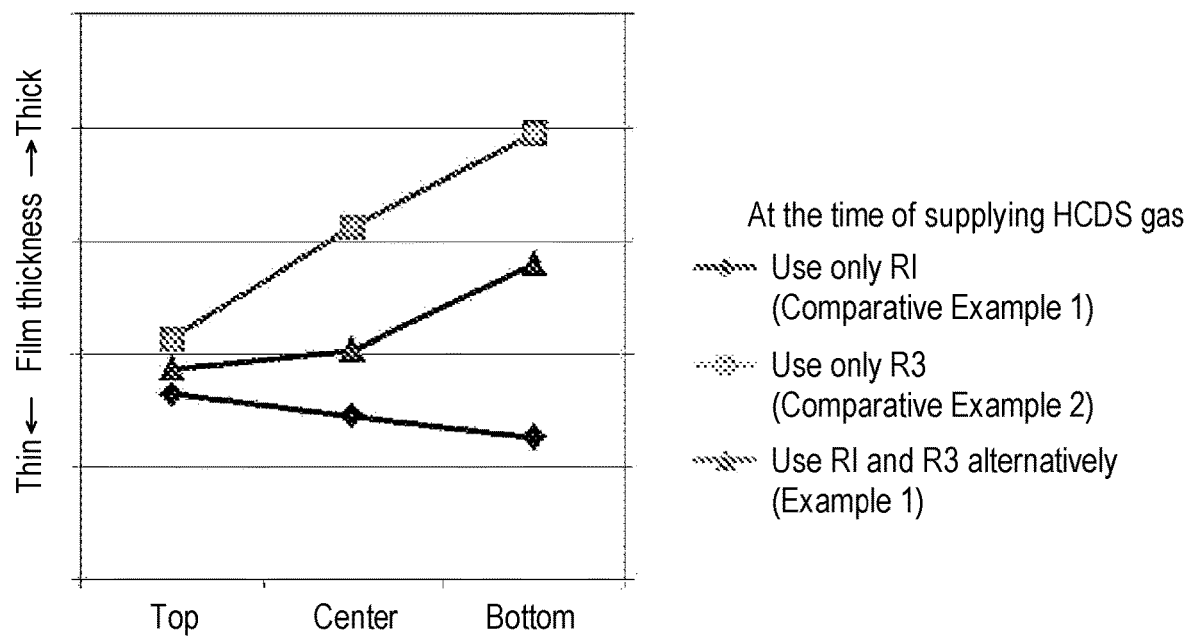
FIGS. 10A and 10B are graphs showing evaluation results of inter-substrate film thickness uniformity of films formed on substrates, respectively.
Figure 10B:
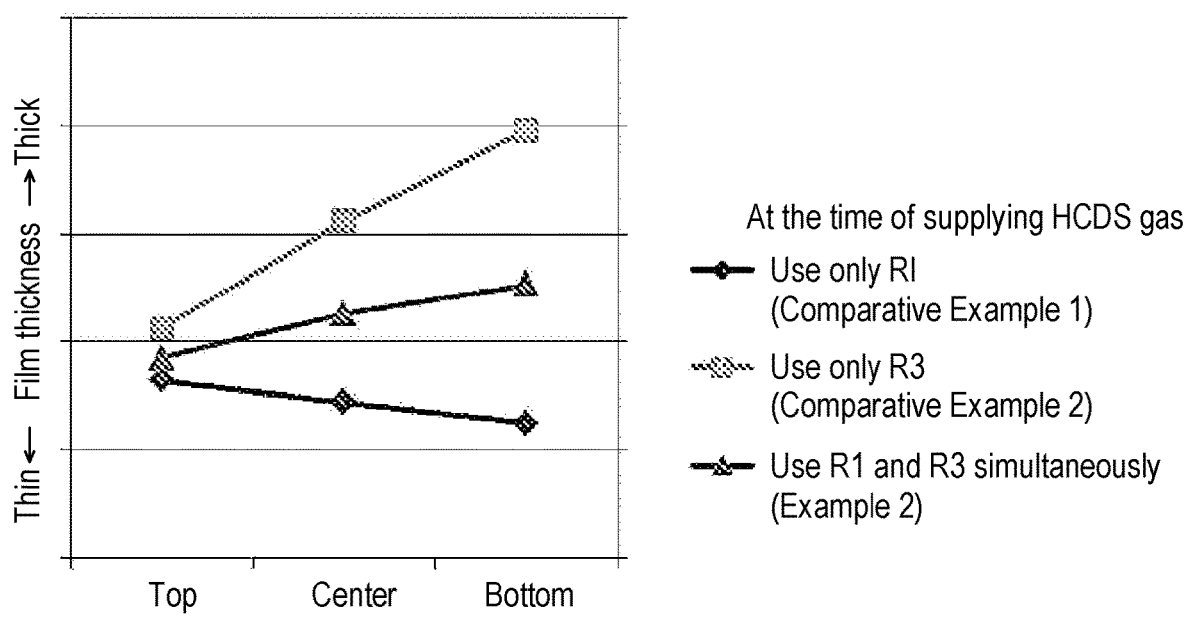

Then, an inter-wafer film thickness distribution of the SiN film formed on the wafer is measured for each of Examples 1 and 2 and Comparative Examples 1 and 2. FIGS. 10A and 10B show measurement results of the inter-wafer film thickness distribution of the SiN film formed on the wafers. Horizontal axes in FIGS. 10A and 10B each represent wafer accommodation positions (Top, Center, and Bottom) in the wafer arrangement region. Vertical axes in FIGS. 10A and 10B each represent the film thickness (a.u.) of the SiN film formed on the wafers. Marks ▲, ♦, and ■ in FIG. 10A indicate Example 1, Comparative Example 1, and Comparative Example 2 in this order. Further, marks ▲, ♦, and ■ in FIG. 10B indicate Example 2, Comparative Example 1, and Comparative Example 2 in this order.

As shown in FIGS. 10A and 10B, in Comparative Example 1 in which the HCDS gas is supplied to the wafers by using only the first nozzle, the inter-wafer film thickness distribution of the SiN film formed on the wafers is a distribution in which the film thickness gradually increases from the Bottom side toward the Top side of the wafer arrangement region. Further, in Comparative Example 2 in which the HCDS gas is supplied to the wafers by using only the second nozzle, the inter-wafer film thickness distribution of the SiN film formed on the wafers is a distribution in which the film thickness gradually decreases from the Bottom side toward the Top side of the wafer arrangement region.

In contrast, as shown in FIG. 10A, in Example 1 in which the HCDS gas is supplied to the wafers by using alternatively the first and second nozzles, the inter-wafer film thickness distribution of the SiN film formed on the wafers is an intermediate distribution between the inter-wafer film thickness distributions in Comparative Examples 1 and 2. Further, as shown in FIG. 10B, in Example 2 in which the HCDS gas is supplied to the wafers by using simultaneously the first and second nozzles, the inter-wafer film thickness distribution of the SiN film formed on the wafers is an intermediate distribution between the inter-wafer film thickness distributions in Comparative Examples 1 and 2.

That is, by using the film-forming sequence shown in FIG. 4 and the film-forming sequence of Modification 7, it was found that the inter-wafer film thickness distribution of the SiN film formed on the wafers can be controlled to improve the inter-wafer film thickness uniformity.

According to the present disclosure in some embodiments, it is possible to control an inter-substrate film thickness distribution of films formed on substrates arranged in a process chamber.

While certain embodiments have been described, these embodiments have been presented by way of example only, and are not intended to limit the scope of the disclosures.

Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate, comprising:
forming a film on at least one substrate by performing a cycle a predetermined number of times, the cycle including:
a first act that includes supplying a precursor to the at least one substrate from at least one first ejecting hole of a first nozzle arranged along a substrate arrangement direction of a substrate arrangement region where the at least one substrate is arranged; and
a second act that includes supplying the precursor to the at least one substrate from at least one second ejecting hole of a second nozzle arranged along the substrate arrangement direction of the substrate arrangement region,
wherein one of the at least one first ejecting hole and the at least one second ejecting hole is configured such that an amount of adsorption of a main element contained in the precursor on a surface of the at least one substrate increases from one end toward the other end of the substrate arrangement region in the substrate arrangement direction, and
wherein the other one of the at least one first ejecting hole and the at least one second ejecting hole, which is different from the one of the at least one first ejecting hole and the at least one second ejecting hole, is configured such that the amount of adsorption of the main element contained in the precursor on the surface of the at least one substrate decreases from the one end toward the other end of the substrate arrangement region in the substrate arrangement direction.

2. The method of claim 1, wherein an opening area of the at least one first ejecting hole and an opening area of the at least one second ejecting hole are different from each other.

3. The method of claim 1, wherein a shape of the at least one first ejecting hole and a shape of the at least one second ejecting hole are different from each other.

4. The method of claim 3, wherein one of the at least one first ejecting hole and the at least one second ejecting hole has a shape including a slit shape, and the other one different from the one of the at least one first ejecting hole and the at least one second ejecting hole has a shape including a circular shape.

5. The method of claim 3, wherein an opening area of one of the at least one first ejecting hole and the at least one second ejecting hole decreases from one end toward the other end of the substrate arrangement region in the substrate arrangement direction.

6. The method of claim 5, wherein an opening area of the other one different from the one of the at least one first ejecting hole and the at least one second ejecting hole increases from the one end toward the other end of the substrate arrangement region in the substrate arrangement direction.

7. The method of claim 5, wherein an opening area of the other one different from the one of the at least one first ejecting hole and the at least one second ejecting hole is uniform from the one end toward the other end of the substrate arrangement region in the substrate arrangement direction.

8. The method of claim 1, wherein one of the at least one first ejecting hole and the at least one second ejecting hole is configured such that a thickness of a layer containing a main element contained in the precursor and being formed on a surface of the at least one substrate increases from one end toward the other end of the substrate arrangement region in the substrate arrangement direction, and
wherein the other one different from the one of the at least one first ejecting hole and the at least one second ejecting hole is configured such that the thickness of the layer containing the main element contained in the precursor and being formed on the surface of the at least one substrate decreases from the one end toward the other end of the substrate arrangement region in the substrate arrangement direction.

9. The method of claim 1, wherein one of the at least one first ejecting hole and the at least one second ejecting hole is configured such that a residence time of the precursor on a surface of the at least one substrate increases from one end toward the other end of the substrate arrangement region in the substrate arrangement direction, and
wherein the other one different from the one of the at least one first ejecting hole and the at least one second ejecting hole is configured such that the residence time of the precursor on the surface of the at least one substrate decreases from the one end toward the other end side of the substrate arrangement region in the substrate arrangement direction.

10. The method of claim 1, wherein one of the at least one first ejecting hole and the at least one second ejecting hole is configured such that a flow velocity of the precursor on a surface of the at least one substrate decreases from one end toward the other end of the substrate arrangement region in the substrate arrangement direction, and
wherein the other one different from the one of the at least one first ejecting hole and the at least one second ejecting hole is configured such that the flow velocity of the precursor on the surface of the at least one substrate increases from the one end toward the other end of the substrate arrangement region in the substrate arrangement direction.

11. The method of claim 1, wherein one of the at least one first ejecting hole and the at least one second ejecting hole is configured such that the amount of adsorption of the main element contained in the precursor on the surface of the at least one substrate increases from one end toward the other end of the substrate arrangement region in the substrate arrangement direction, and
wherein the other one of the at least one first ejecting hole and the at least one second ejecting hole, which is different from the one of the at least one first ejecting hole and the at least one second ejecting hole, is configured such that the amount of adsorption of the main element contained in the precursor on the surface of the at least one substrate gradually decreases from the one end toward the other end of the substrate arrangement region in the substrate arrangement direction.

12. The method of claim 1, wherein, in the cycle, the first act is performed a first number of times and the second act is performed a second number of times, and
wherein at least one selected from the group of an inter-substrate film thickness uniformity and an inter-substrate composition uniformity of the film formed on the at least one substrate is controlled by respectively controlling the first number of times and the second number of times.

13. The method of claim 1, wherein the precursor supplied from the first nozzle and the precursor supplied from the second nozzle are halosilane.

14. The method of claim 13, wherein the precursor supplied from the first nozzle and the precursor supplied from the second nozzle are chlorosilane.

15. The method of claim 1, wherein the first act further includes supplying a reactant to the at least one substrate and the second act further includes supplying the reactant to the at least one substrate.

16. The method of claim 15, wherein the first act further includes performing a first set a predetermined number of times, the first set including:
   supplying the precursor to the at least one substrate from the at least one first ejecting hole of the first nozzle; and
   supplying the reactant to the at least one substrate.

17. The method of claim 15, wherein the second act further includes performing a second set a predetermined number of times, the second set including:
   supplying the precursor to the at least one substrate from the at least one second ejecting hole of the second nozzle; and
   supplying the reactant to the at least one substrate.

18. The method of claim 1, wherein at least a portion of an installation region of the at least one first ejecting hole in the first nozzle and at least a portion of an installation region of the at least one second ejecting hole in the second nozzle overlap each other in the substrate arrangement direction.

19. A method of manufacturing a semiconductor device, comprising:

forming a film on at least one substrate by performing a cycle a predetermined number of times, the cycle including:

a first act that includes supplying a precursor to the at least one substrate from at least one first ejecting hole of a first nozzle arranged along a substrate arrangement direction of a substrate arrangement region where the at least one substrate is arranged; and a second act that includes supplying the precursor to the at least one substrate from at least one second ejecting hole of a second nozzle arranged along the substrate arrangement direction of the substrate arrangement region, wherein one of the at least one first ejecting hole and the at least one second ejecting hole is configured such that an amount of adsorption of a main element contained in the precursor on a surface of the at least one substrate increases from one end toward the other end of the substrate arrangement region in the substrate arrangement direction, and wherein the other one of the at least one first ejecting hole and the at least one second ejecting hole, which is different from the one of the at least one first ejecting hole and the at least one second ejecting hole, is configured such that the amount of adsorption of the main element contained in the precursor on the surface of the at least one substrate decreases from the one end toward the other end of the substrate arrangement region in the substrate arrangement direction.

* * * * *